US008816967B2

(12) United States Patent
Lyon et al.

(10) Patent No.: US 8,816,967 B2
(45) Date of Patent: Aug. 26, 2014

(54) CAPACITIVE SENSOR HAVING ELECTRODES ARRANGED ON THE SUBSTRATE AND THE FLEX CIRCUIT

(75) Inventors: Benjamin Lyon, Cupertino, CA (US); Joseph Fisher, Cupertino, CA (US); Lakshman Rathnam, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 958 days.

(21) Appl. No.: 12/237,687

(22) Filed: Sep. 25, 2008

(65) Prior Publication Data

US 2010/0073319 A1    Mar. 25, 2010

(51) Int. Cl.
*G06F 3/041* (2006.01)
*G06F 3/044* (2006.01)

(52) U.S. Cl.
USPC ....................................... 345/173; 178/18.06

(58) Field of Classification Search
CPC ....... G06F 3/041; G06F 3/0412; G06F 3/044; G06F 3/047; G06F 2203/04102; G06F 2203/04103; G06F 2203/04111; G06F 2203/04112; H03K 17/955; H03K 17/962
USPC ......... 345/173–178; 178/18.01–18.11; 341/5, 341/20; 323/904
See application file for complete search history.

(56) References Cited

U.S. PATENT DOCUMENTS

| | | | |
|---|---|---|---|
| 1,061,578 A | 5/1913 | Wischhusen et al. | |
| 2,063,276 A | 12/1936 | Thomas | |
| 2,798,907 A | 7/1957 | Schneider | |
| 2,903,229 A | 9/1959 | Landge | |
| 2,945,111 A | 7/1960 | McCormick | |
| 3,005,055 A | 10/1961 | Mattke | |
| 3,965,399 A | 6/1976 | Walker et al. | |
| 3,996,441 A | 12/1976 | Ohashi | |
| 4,029,915 A | 6/1977 | Ojima | |
| 4,103,252 A | 7/1978 | Bobick | |
| 4,110,749 A | 8/1978 | Janko et al. | |
| 4,115,670 A | 9/1978 | Chandler | |
| 4,121,204 A | 10/1978 | Welch et al. | |
| 4,129,747 A | 12/1978 | Pepper | |
| 4,158,216 A | 6/1979 | Bigelow | |
| 4,242,676 A | 12/1980 | Piguet et al. | |
| 4,246,452 A | 1/1981 | Chandler | |

(Continued)

FOREIGN PATENT DOCUMENTS

| | | |
|---|---|---|
| CN | 1139235 | 1/1997 |
| CN | 1459021 | 11/2003 |

(Continued)

OTHER PUBLICATIONS

Tsuk et al., U.S. Office Action mailed Aug. 7, 2009, directed to U.S. Appl. No. 11/610,181; 20 pages.

(Continued)

*Primary Examiner* — Joe H Cheng
*Assistant Examiner* — Keith Crawley
(74) *Attorney, Agent, or Firm* — Morrison & Foerster LLP

(57) ABSTRACT

A capacitive sensor may include a flex circuit, a substrate facing the flex circuit, and conductive electrodes configured to sense an input applied to the substrate. At least one of the conductive electrodes is associated with a surface of the substrate and an at least one of the electrodes is associated with a surface of the flex circuit.

37 Claims, 13 Drawing Sheets

(56) References Cited

U.S. PATENT DOCUMENTS

| | | |
|---|---|---|
| 4,264,903 A | 4/1981 | Bigelow |
| 4,266,144 A | 5/1981 | Bristol |
| 4,293,734 A | 10/1981 | Pepper, Jr. |
| D264,969 S | 6/1982 | McGoutry |
| 4,338,502 A | 7/1982 | Hashimoto et al. |
| 4,380,007 A | 4/1983 | Steinegger |
| 4,380,040 A | 4/1983 | Posset |
| 4,394,649 A | 7/1983 | Suchoff et al. |
| 4,475,008 A | 10/1984 | Doi et al. |
| 4,570,149 A | 2/1986 | Thornburg et al. |
| 4,583,161 A | 4/1986 | Gunderson et al. |
| 4,587,378 A | 5/1986 | Moore |
| 4,604,786 A | 8/1986 | Howie, Jr. |
| 4,613,736 A | 9/1986 | Shichijo et al. |
| 4,644,100 A | 2/1987 | Brenner et al. |
| 4,719,524 A | 1/1988 | Morishima et al. |
| 4,734,034 A | 3/1988 | Maness et al. |
| 4,736,191 A | 4/1988 | Matzke et al. |
| 4,739,191 A | 4/1988 | Puar |
| 4,739,299 A | 4/1988 | Eventoff et al. |
| 4,752,655 A | 6/1988 | Tajiri et al. |
| 4,755,765 A | 7/1988 | Ferland |
| 4,764,717 A | 8/1988 | Tucker et al. |
| 4,771,139 A | 9/1988 | DeSmet |
| 4,798,919 A | 1/1989 | Miessler et al. |
| 4,810,992 A | 3/1989 | Eventoff |
| 4,822,957 A | 4/1989 | Talmage, Jr. et al. |
| 4,831,359 A | 5/1989 | Newell |
| 4,849,852 A | 7/1989 | Mullins |
| 4,856,993 A | 8/1989 | Maness et al. |
| 4,860,768 A | 8/1989 | Hon et al. |
| 4,866,602 A | 9/1989 | Hall |
| 4,876,524 A | 10/1989 | Jenkins |
| 4,897,511 A | 1/1990 | Itaya et al. |
| 4,914,624 A | 4/1990 | Dunthorn |
| 4,917,516 A | 4/1990 | Retter |
| 4,943,889 A | 7/1990 | Ohmatoi |
| 4,951,036 A | 8/1990 | Grueter et al. |
| 4,954,823 A | 9/1990 | Binstead |
| 4,976,435 A | 12/1990 | Shatford et al. |
| 4,990,900 A | 2/1991 | Kikuchi |
| 5,008,497 A | 4/1991 | Asher |
| 5,036,321 A | 7/1991 | Leach et al. |
| 5,053,757 A | 10/1991 | Meadows |
| 5,086,870 A | 2/1992 | Bolduc |
| 5,125,077 A | 6/1992 | Hall |
| 5,159,159 A | 10/1992 | Asher |
| 5,179,648 A | 1/1993 | Hauck |
| 5,186,646 A | 2/1993 | Pederson |
| 5,192,082 A | 3/1993 | Inoue et al. |
| 5,193,669 A | 3/1993 | Demeo et al. |
| 5,231,326 A | 7/1993 | Echols |
| 5,237,311 A | 8/1993 | Mailey et al. |
| 5,278,362 A | 1/1994 | Ohashi |
| 5,305,017 A | 4/1994 | Gerpheide |
| 5,313,027 A | 5/1994 | Inoue et al. |
| D349,280 S | 8/1994 | Kaneko |
| 5,339,213 A | 8/1994 | O'Callaghan |
| 5,367,199 A | 11/1994 | Lefkowitz et al. |
| 5,374,787 A | 12/1994 | Miller et al. |
| 5,379,057 A | 1/1995 | Clough et al. |
| 5,404,152 A | 4/1995 | Nagai |
| 5,408,621 A | 4/1995 | Ben-Arie |
| 5,414,445 A | 5/1995 | Kaneko et al. |
| 5,416,498 A | 5/1995 | Grant |
| 5,424,756 A | 6/1995 | Ho et al. |
| 5,432,531 A | 7/1995 | Calder et al. |
| 5,438,331 A | 8/1995 | Gilligan et al. |
| D362,431 S | 9/1995 | Kaneko et al. |
| 5,450,075 A | 9/1995 | Waddington |
| 5,453,761 A | 9/1995 | Tanaka |
| 5,473,343 A | 12/1995 | Kimmich et al. |
| 5,473,344 A | 12/1995 | Bacon et al. |
| 5,479,192 A | 12/1995 | Carroll, Jr. et al. |
| 5,494,157 A | 2/1996 | Golenz et al. |
| 5,495,566 A | 2/1996 | Kwatinetz |
| 5,508,703 A | 4/1996 | Okamura et al. |
| 5,508,717 A | 4/1996 | Miller |
| 5,543,588 A | 8/1996 | Bisset et al. |
| 5,543,591 A | 8/1996 | Gillespie et al. |
| 5,555,004 A | 9/1996 | Ono et al. |
| 5,559,301 A | 9/1996 | Bryan, Jr. et al. |
| 5,559,943 A | 9/1996 | Cyr et al. |
| 5,561,445 A | 10/1996 | Miwa et al. |
| 5,564,112 A | 10/1996 | Hayes et al. |
| 5,565,887 A | 10/1996 | McCambridge et al. |
| 5,578,817 A | 11/1996 | Bidiville et al. |
| 5,581,670 A | 12/1996 | Bier et al. |
| 5,585,823 A | 12/1996 | Duchon et al. |
| 5,589,856 A | 12/1996 | Stein et al. |
| 5,589,893 A | 12/1996 | Gaughan et al. |
| 5,596,347 A | 1/1997 | Robertson et al. |
| 5,596,697 A | 1/1997 | Foster et al. |
| 5,598,183 A | 1/1997 | Robertson et al. |
| 5,611,040 A | 3/1997 | Brewer et al. |
| 5,611,060 A | 3/1997 | Belfiore et al. |
| 5,613,137 A | 3/1997 | Bertram et al. |
| 5,617,114 A | 4/1997 | Bier et al. |
| 5,627,531 A | 5/1997 | Posso et al. |
| 5,632,679 A | 5/1997 | Tremmel |
| 5,640,258 A | 6/1997 | Kurashima et al. |
| 5,648,642 A | 7/1997 | Miller et al. |
| D382,550 S | 8/1997 | Kaneko et al. |
| 5,657,012 A | 8/1997 | Tait |
| 5,661,632 A | 8/1997 | Register |
| D385,542 S | 10/1997 | Kaneko et al. |
| 5,675,362 A | 10/1997 | Clough et al. |
| 5,689,285 A | 11/1997 | Asher |
| 5,721,849 A | 2/1998 | Amro |
| 5,726,687 A | 3/1998 | Belfiore et al. |
| 5,729,219 A | 3/1998 | Armstrong et al. |
| 5,730,165 A | 3/1998 | Philipp |
| 5,748,185 A | 5/1998 | Stephan et al. |
| 5,751,274 A | 5/1998 | Davis |
| 5,754,890 A | 5/1998 | Holmdahl et al. |
| 5,764,066 A | 6/1998 | Novak et al. |
| 5,777,605 A | 7/1998 | Yoshinobu et al. |
| 5,786,818 A | 7/1998 | Brewer et al. |
| 5,790,769 A | 8/1998 | Buxton et al. |
| 5,798,752 A | 8/1998 | Buxton et al. |
| 5,805,144 A | 9/1998 | Scholder et al. |
| 5,808,602 A | 9/1998 | Sellers |
| 5,812,239 A | 9/1998 | Eger |
| 5,812,498 A | 9/1998 | Terés |
| 5,815,141 A | 9/1998 | Phares |
| 5,825,351 A | 10/1998 | Tam |
| 5,825,352 A | 10/1998 | Bisset et al. |
| 5,825,353 A | 10/1998 | Will |
| 5,828,364 A | 10/1998 | Siddiqui |
| 5,838,304 A | 11/1998 | Hall |
| 5,841,078 A | 11/1998 | Miller et al. |
| 5,841,423 A | 11/1998 | Carroll, Jr. et al. |
| D402,281 S | 12/1998 | Ledbetter et al. |
| 5,850,213 A | 12/1998 | Imai et al. |
| 5,856,645 A | 1/1999 | Norton |
| 5,856,822 A | 1/1999 | Du et al. |
| 5,859,629 A | 1/1999 | Tognazzini |
| 5,861,875 A | 1/1999 | Gerpheide |
| 5,869,791 A | 2/1999 | Young |
| 5,875,311 A | 2/1999 | Bertram et al. |
| 5,883,619 A | 3/1999 | Ho et al. |
| 5,889,236 A | 3/1999 | Gillespie et al. |
| 5,889,511 A | 3/1999 | Ong et al. |
| 5,894,117 A | 4/1999 | Kamishima |
| 5,903,229 A | 5/1999 | Kishi |
| 5,907,152 A | 5/1999 | Dandliker et al. |
| 5,907,318 A | 5/1999 | Medina |
| 5,909,211 A | 6/1999 | Combs et al. |
| 5,910,802 A | 6/1999 | Shields et al. |
| 5,914,706 A | 6/1999 | Kono |
| 5,923,388 A | 7/1999 | Kurashima et al. |
| D412,940 S | 8/1999 | Kato et al. |
| 5,933,102 A | 8/1999 | Miller et al. |
| 5,933,141 A | 8/1999 | Smith |

(56) References Cited

U.S. PATENT DOCUMENTS

| | | |
|---|---|---|
| 5,936,619 A | 8/1999 | Nagasaki et al. |
| 5,943,044 A | 8/1999 | Martinelli et al. |
| 5,953,000 A | 9/1999 | Weirich |
| 5,956,019 A | 9/1999 | Bang et al. |
| 5,959,610 A | 9/1999 | Silfvast |
| 5,959,611 A | 9/1999 | Smailagic et al. |
| 5,964,661 A | 10/1999 | Dodge |
| 5,973,668 A | 10/1999 | Watanabe |
| 6,000,000 A | 12/1999 | Hawkins et al. |
| 6,002,093 A | 12/1999 | Hrehor et al. |
| 6,002,389 A | 12/1999 | Kasser et al. |
| 6,005,299 A | 12/1999 | Hengst |
| 6,025,832 A | 2/2000 | Sudo et al. |
| 6,031,518 A | 2/2000 | Adams et al. |
| 6,034,672 A | 3/2000 | Gaultier et al. |
| 6,057,829 A | 5/2000 | Silfvast |
| 6,075,533 A | 6/2000 | Chang |
| 6,084,574 A | 7/2000 | Bidiville |
| D430,169 S | 8/2000 | Scibora |
| 6,097,372 A | 8/2000 | Suzuki |
| 6,104,790 A | 8/2000 | Narayanaswami |
| 6,122,526 A | 9/2000 | Parulski et al. |
| 6,124,587 A | 9/2000 | Bidiville et al. |
| 6,128,006 A | 10/2000 | Rosenberg et al. |
| 6,131,048 A | 10/2000 | Sudo et al. |
| 6,141,068 A | 10/2000 | Iijima |
| 6,147,856 A | 11/2000 | Karidis |
| 6,163,312 A | 12/2000 | Furuya |
| 6,166,721 A | 12/2000 | Kuroiwa et al. |
| 6,179,496 B1 | 1/2001 | Chou |
| 6,181,322 B1 | 1/2001 | Nanavati |
| D437,860 S | 2/2001 | Suzuki et al. |
| 6,188,391 B1 * | 2/2001 | Seely et al. ............ 345/173 |
| 6,188,393 B1 | 2/2001 | Shu |
| 6,191,774 B1 | 2/2001 | Schena et al. |
| 6,198,054 B1 | 3/2001 | Janniere |
| 6,198,473 B1 | 3/2001 | Armstrong |
| 6,211,861 B1 | 4/2001 | Rosenberg et al. |
| 6,219,038 B1 | 4/2001 | Cho |
| 6,222,528 B1 | 4/2001 | Gerpheide et al. |
| D442,592 S | 5/2001 | Ledbetter et al. |
| 6,225,976 B1 | 5/2001 | Yates et al. |
| 6,225,980 B1 | 5/2001 | Weiss et al. |
| 6,226,534 B1 | 5/2001 | Aizawa |
| 6,227,966 B1 | 5/2001 | Yokoi |
| D443,616 S | 6/2001 | Fisher et al. |
| 6,243,078 B1 | 6/2001 | Rosenberg |
| 6,243,080 B1 | 6/2001 | Molne |
| 6,243,646 B1 | 6/2001 | Ozaki et al. |
| 6,248,017 B1 | 6/2001 | Roach |
| 6,254,477 B1 | 7/2001 | Sasaki et al. |
| 6,256,011 B1 | 7/2001 | Culver |
| 6,259,491 B1 | 7/2001 | Ekedahl et al. |
| 6,262,717 B1 | 7/2001 | Donohue et al. |
| 6,262,785 B1 | 7/2001 | Kim |
| 6,266,050 B1 | 7/2001 | Oh et al. |
| 6,285,211 B1 | 9/2001 | Sample et al. |
| D448,810 S | 10/2001 | Goto |
| 6,297,795 B1 | 10/2001 | Kato et al. |
| 6,297,811 B1 | 10/2001 | Kent et al. |
| 6,300,946 B1 | 10/2001 | Lincke et al. |
| 6,307,539 B2 | 10/2001 | Suzuki |
| D450,713 S | 11/2001 | Masamitsu et al. |
| 6,314,483 B1 | 11/2001 | Goto et al. |
| 6,321,441 B1 | 11/2001 | Davidson et al. |
| 6,323,845 B1 | 11/2001 | Robbins |
| D452,250 S | 12/2001 | Chan |
| 6,337,678 B1 | 1/2002 | Fish |
| 6,340,800 B1 | 1/2002 | Zhai et al. |
| D454,568 S | 3/2002 | Andre et al. |
| 6,357,887 B1 | 3/2002 | Novak |
| D455,793 S | 4/2002 | Lin |
| 6,373,265 B1 | 4/2002 | Morimoto et al. |
| 6,373,470 B1 | 4/2002 | Andre et al. |
| 6,377,530 B1 | 4/2002 | Burrows |
| 6,396,523 B1 | 5/2002 | Segal et al. |
| 6,424,338 B1 | 7/2002 | Anderson |
| 6,429,846 B2 | 8/2002 | Rosenberg et al. |
| 6,429,852 B1 | 8/2002 | Adams et al. |
| 6,452,514 B1 | 9/2002 | Philipp |
| 6,465,271 B1 | 10/2002 | Ko et al. |
| 6,473,069 B1 | 10/2002 | Gerphelde |
| 6,492,602 B2 | 12/2002 | Asai et al. |
| 6,492,979 B1 | 12/2002 | Kent et al. |
| 6,496,181 B1 | 12/2002 | Bomer et al. |
| 6,497,412 B1 | 12/2002 | Bramm |
| D468,365 S | 1/2003 | Bransky et al. |
| D469,109 S | 1/2003 | Andre et al. |
| D472,245 S | 3/2003 | Andre et al. |
| 6,546,231 B1 | 4/2003 | Someya et al. |
| 6,563,487 B2 | 5/2003 | Martin et al. |
| 6,587,091 B2 | 7/2003 | Serpa |
| 6,606,244 B1 | 8/2003 | Liu et al. |
| 6,618,909 B1 | 9/2003 | Yang |
| 6,636,197 B1 | 10/2003 | Goldenberg et al. |
| 6,639,584 B1 | 10/2003 | Li |
| 6,640,250 B1 | 10/2003 | Chang et al. |
| 6,650,975 B2 | 11/2003 | Ruffner |
| D483,809 S | 12/2003 | Lim |
| 6,658,773 B2 | 12/2003 | Rohne et al. |
| 6,664,951 B1 | 12/2003 | Fujii et al. |
| 6,677,927 B1 | 1/2004 | Bruck et al. |
| 6,678,891 B1 | 1/2004 | Wilcox et al. |
| 6,686,904 B1 | 2/2004 | Sherman et al. |
| 6,686,906 B2 | 2/2004 | Salminen et al. |
| 6,703,550 B2 | 3/2004 | Chu |
| 6,724,817 B1 | 4/2004 | Simpson et al. |
| 6,727,889 B2 | 4/2004 | Shaw |
| D489,731 S | 5/2004 | Huang |
| 6,738,045 B2 | 5/2004 | Hinckley et al. |
| 6,750,803 B2 | 6/2004 | Yates et al. |
| 6,781,576 B2 | 8/2004 | Tamura |
| 6,784,384 B2 | 8/2004 | Park et al. |
| 6,788,288 B2 | 9/2004 | Ano |
| 6,791,533 B2 | 9/2004 | Su |
| 6,795,057 B2 | 9/2004 | Gordon |
| D497,618 S | 10/2004 | Andre et al. |
| 6,810,271 B1 | 10/2004 | Wood et al. |
| 6,822,640 B2 | 11/2004 | Derocher |
| 6,834,975 B2 | 12/2004 | Chu-Chia et al. |
| 6,844,872 B1 | 1/2005 | Farag et al. |
| 6,855,899 B2 | 2/2005 | Sotome |
| 6,865,718 B2 | 3/2005 | Montalcini |
| 6,886,842 B2 | 5/2005 | Vey et al. |
| 6,894,916 B2 | 5/2005 | Reohr et al. |
| D506,476 S | 6/2005 | Andre et al. |
| 6,922,189 B2 | 7/2005 | Fujiyoshi |
| 6,930,494 B2 | 8/2005 | Tesdahl et al. |
| 6,958,614 B2 | 10/2005 | Morimoto |
| 6,977,808 B2 | 12/2005 | Lam et al. |
| 6,978,127 B1 | 12/2005 | Bulthuis et al. |
| 6,985,137 B2 | 1/2006 | Kaikuranta |
| 7,006,077 B1 | 2/2006 | Uusimäki |
| 7,019,225 B2 | 3/2006 | Matsumoto et al. |
| 7,046,230 B2 | 5/2006 | Zadesky et al. |
| 7,050,292 B2 | 5/2006 | Shimura et al. |
| 7,069,044 B2 | 6/2006 | Okada et al. |
| 7,078,633 B2 | 7/2006 | Ihalainen |
| 7,084,856 B2 | 8/2006 | Huppi |
| 7,113,196 B2 | 9/2006 | Kerr |
| 7,117,136 B1 | 10/2006 | Rosedale |
| 7,119,792 B1 | 10/2006 | Andre et al. |
| 7,215,319 B2 | 5/2007 | Kamijo et al. |
| 7,233,318 B1 | 6/2007 | Farag et al. |
| 7,236,154 B1 | 6/2007 | Kerr et al. |
| 7,236,159 B1 | 6/2007 | Siversson |
| 7,253,643 B1 | 8/2007 | Seguine |
| 7,279,647 B2 | 10/2007 | Philipp |
| 7,288,732 B2 | 10/2007 | Hashida |
| 7,297,883 B2 | 11/2007 | Rochon et al. |
| 7,310,089 B2 | 12/2007 | Baker et al. |
| 7,312,785 B2 | 12/2007 | Tsuk et al. |
| 7,321,103 B2 | 1/2008 | Nakanishi et al. |
| 7,333,092 B2 | 2/2008 | Zadesky et al. |

(56) References Cited

U.S. PATENT DOCUMENTS

| | | | |
|---|---|---|---|
| 7,348,898 B2 | 3/2008 | Ono | |
| 7,382,139 B2 | 6/2008 | Mackey | |
| 7,394,038 B2 | 7/2008 | Chang | |
| 7,395,081 B2 | 7/2008 | Bonnelykke Kristensen et al. | |
| 7,397,467 B2 | 7/2008 | Park et al. | |
| 7,439,963 B2 | 10/2008 | Geaghan et al. | |
| 7,466,307 B2 | 12/2008 | Trent et al. | |
| 7,479,949 B2 | 1/2009 | Jobs et al. | |
| 7,486,323 B2 | 2/2009 | Lee et al. | |
| 7,502,016 B2 | 3/2009 | Trent, Jr. et al. | |
| 7,503,193 B2 | 3/2009 | Schoene et al. | |
| 7,593,782 B2 | 9/2009 | Jobs et al. | |
| 7,645,955 B2 | 1/2010 | Huang et al. | |
| 7,671,837 B2 | 3/2010 | Forsblad et al. | |
| 7,708,051 B2 | 5/2010 | Katsumi et al. | |
| 7,772,507 B2 | 8/2010 | Orr et al. | |
| 2001/0011991 A1 | 8/2001 | Wang et al. | |
| 2001/0011993 A1 | 8/2001 | Saarinen | |
| 2001/0024194 A1 * | 9/2001 | Shigetaka et al. | 345/173 |
| 2001/0033270 A1 | 10/2001 | Osawa et al. | |
| 2001/0043545 A1 | 11/2001 | Aratani | |
| 2001/0050673 A1 | 12/2001 | Davenport | |
| 2001/0051046 A1 | 12/2001 | Watanabe et al. | |
| 2002/0000978 A1 | 1/2002 | Gerpheide | |
| 2002/0011993 A1 | 1/2002 | Lui et al. | |
| 2002/0027547 A1 | 3/2002 | Kamijo | |
| 2002/0030665 A1 | 3/2002 | Ano | |
| 2002/0033848 A1 | 3/2002 | Sciammarella et al. | |
| 2002/0039493 A1 | 4/2002 | Tanaka | |
| 2002/0045960 A1 | 4/2002 | Phillips et al. | |
| 2002/0071550 A1 | 6/2002 | Pletikosa | |
| 2002/0089545 A1 | 7/2002 | Levi Montalcini | |
| 2002/0103796 A1 | 8/2002 | Hartley | |
| 2002/0118131 A1 | 8/2002 | Yates et al. | |
| 2002/0118169 A1 | 8/2002 | Hinckley et al. | |
| 2002/0145594 A1 | 10/2002 | Derocher | |
| 2002/0154090 A1 | 10/2002 | Lin | |
| 2002/0158844 A1 | 10/2002 | McLoone et al. | |
| 2002/0164156 A1 | 11/2002 | Bilbrey | |
| 2002/0168947 A1 | 11/2002 | Lemley | |
| 2002/0180701 A1 | 12/2002 | Hayama et al. | |
| 2002/0196239 A1 | 12/2002 | Lee | |
| 2003/0002246 A1 | 1/2003 | Kerr | |
| 2003/0025679 A1 | 2/2003 | Taylor et al. | |
| 2003/0028346 A1 | 2/2003 | Sinclair et al. | |
| 2003/0043121 A1 | 3/2003 | Chen | |
| 2003/0043174 A1 | 3/2003 | Hinckley et al. | |
| 2003/0050092 A1 | 3/2003 | Yun | |
| 2003/0076301 A1 | 4/2003 | Tsuk et al. | |
| 2003/0076303 A1 | 4/2003 | Huppi | |
| 2003/0076306 A1 | 4/2003 | Zadesky et al. | |
| 2003/0091377 A1 | 5/2003 | Hsu et al. | |
| 2003/0095095 A1 | 5/2003 | Pihlaja | |
| 2003/0095096 A1 | 5/2003 | Robbin et al. | |
| 2003/0098851 A1 | 5/2003 | Brink | |
| 2003/0103043 A1 | 6/2003 | Mulligan et al. | |
| 2003/0122792 A1 | 7/2003 | Yamamoto et al. | |
| 2003/0135292 A1 | 7/2003 | Husgafvel et al. | |
| 2003/0142081 A1 | 7/2003 | Iizuka et al. | |
| 2003/0184517 A1 | 10/2003 | Senzui et al. | |
| 2003/0197740 A1 | 10/2003 | Reponen | |
| 2003/0206202 A1 | 11/2003 | Moriya | |
| 2003/0210537 A1 | 11/2003 | Engelmann | |
| 2003/0224831 A1 | 12/2003 | Engstrom et al. | |
| 2004/0027341 A1 | 2/2004 | Derocher | |
| 2004/0074756 A1 | 4/2004 | Kawakami et al. | |
| 2004/0080682 A1 | 4/2004 | Dalton | |
| 2004/0109357 A1 | 6/2004 | Cernea et al. | |
| 2004/0150619 A1 | 8/2004 | Baudisch et al. | |
| 2004/0156192 A1 | 8/2004 | Kerr et al. | |
| 2004/0178997 A1 | 9/2004 | Gillespie et al. | |
| 2004/0200699 A1 | 10/2004 | Matsumoto et al. | |
| 2004/0215986 A1 | 10/2004 | Shakkarwar | |
| 2004/0224638 A1 | 11/2004 | Fadell et al. | |
| 2004/0239622 A1 | 12/2004 | Proctor et al. | |
| 2004/0252109 A1 | 12/2004 | Trent, Jr. et al. | |
| 2004/0252867 A1 | 12/2004 | Lan et al. | |
| 2004/0253989 A1 | 12/2004 | Tupler et al. | |
| 2004/0263388 A1 | 12/2004 | Krumm et al. | |
| 2004/0267874 A1 | 12/2004 | Westberg et al. | |
| 2005/0012644 A1 | 1/2005 | Hurst et al. | |
| 2005/0017957 A1 | 1/2005 | Yi | |
| 2005/0024341 A1 | 2/2005 | Gillespie et al. | |
| 2005/0030048 A1 | 2/2005 | Bolender | |
| 2005/0052425 A1 | 3/2005 | Zadesky et al. | |
| 2005/0052426 A1 | 3/2005 | Hagermoser et al. | |
| 2005/0052429 A1 | 3/2005 | Philipp | |
| 2005/0068304 A1 | 3/2005 | Lewis et al. | |
| 2005/0083299 A1 | 4/2005 | Nagasaka | |
| 2005/0083307 A1 | 4/2005 | Aufderheide | |
| 2005/0090288 A1 | 4/2005 | Stohr et al. | |
| 2005/0104867 A1 | 5/2005 | Westerman et al. | |
| 2005/0110768 A1 | 5/2005 | Marriott et al. | |
| 2005/0126831 A1 * | 6/2005 | Richter et al. | 178/18.01 |
| 2005/0129199 A1 | 6/2005 | Abe | |
| 2005/0139460 A1 | 6/2005 | Hosaka | |
| 2005/0140657 A1 | 6/2005 | Park et al. | |
| 2005/0143124 A1 | 6/2005 | Kennedy et al. | |
| 2005/0156881 A1 | 7/2005 | Trent et al. | |
| 2005/0162402 A1 | 7/2005 | Watanachote | |
| 2005/0204309 A1 | 9/2005 | Szeto | |
| 2005/0237308 A1 | 10/2005 | Autio et al. | |
| 2006/0026521 A1 | 2/2006 | Hotelling et al. | |
| 2006/0026535 A1 | 2/2006 | Hotelling et al. | |
| 2006/0026536 A1 | 2/2006 | Hotelling et al. | |
| 2006/0032680 A1 | 2/2006 | Elias et al. | |
| 2006/0038791 A1 | 2/2006 | Mackey | |
| 2006/0066582 A1 | 3/2006 | Lyon et al. | |
| 2006/0066588 A1 | 3/2006 | Lyon et al. | |
| 2006/0095848 A1 | 5/2006 | Naik | |
| 2006/0097991 A1 | 5/2006 | Hotelling et al. | |
| 2006/0131156 A1 | 6/2006 | Voelckers | |
| 2006/0143574 A1 | 6/2006 | Ito et al. | |
| 2006/0174568 A1 | 8/2006 | Kinoshita et al. | |
| 2006/0181517 A1 | 8/2006 | Zadesky et al. | |
| 2006/0197750 A1 | 9/2006 | Kerr et al. | |
| 2006/0236262 A1 | 10/2006 | Bathiche et al. | |
| 2006/0250377 A1 | 11/2006 | Zadesky et al. | |
| 2006/0274042 A1 | 12/2006 | Krah et al. | |
| 2006/0274905 A1 | 12/2006 | Lindahl et al. | |
| 2006/0279896 A1 | 12/2006 | Bruwer | |
| 2006/0284836 A1 | 12/2006 | Philipp | |
| 2007/0013671 A1 | 1/2007 | Zadesky et al. | |
| 2007/0018970 A1 | 1/2007 | Tabasso et al. | |
| 2007/0052044 A1 | 3/2007 | Forsblad et al. | |
| 2007/0052691 A1 | 3/2007 | Zadesky et al. | |
| 2007/0080936 A1 | 4/2007 | Tsuk et al. | |
| 2007/0080938 A1 | 4/2007 | Robbin et al. | |
| 2007/0080952 A1 | 4/2007 | Lynch et al. | |
| 2007/0083822 A1 | 4/2007 | Robbin et al. | |
| 2007/0085841 A1 | 4/2007 | Tsuk et al. | |
| 2007/0097086 A1 | 5/2007 | Battles et al. | |
| 2007/0120834 A1 | 5/2007 | Boillot | |
| 2007/0126696 A1 | 6/2007 | Boillot | |
| 2007/0152975 A1 | 7/2007 | Ogihara | |
| 2007/0152977 A1 | 7/2007 | Ng et al. | |
| 2007/0152983 A1 | 7/2007 | McKillop et al. | |
| 2007/0155434 A1 | 7/2007 | Jobs et al. | |
| 2007/0157089 A1 | 7/2007 | Van Os et al. | |
| 2007/0242057 A1 | 10/2007 | Zadesky et al. | |
| 2007/0247421 A1 | 10/2007 | Orsley et al. | |
| 2007/0247443 A1 | 10/2007 | Philipp | |
| 2007/0271516 A1 | 11/2007 | Carmichael | |
| 2007/0273660 A1 * | 11/2007 | XiaoPing | 345/173 |
| 2007/0273671 A1 | 11/2007 | Zadesky et al. | |
| 2007/0276525 A1 | 11/2007 | Zadesky et al. | |
| 2007/0279394 A1 | 12/2007 | Lampell | |
| 2007/0285404 A1 | 12/2007 | Rimon et al. | |
| 2007/0290990 A1 | 12/2007 | Robbin et al. | |
| 2007/0291016 A1 | 12/2007 | Philipp | |
| 2007/0296709 A1 | 12/2007 | GuangHai | |
| 2008/0006453 A1 | 1/2008 | Hotelling et al. | |
| 2008/0006454 A1 | 1/2008 | Hotelling | |
| 2008/0007533 A1 | 1/2008 | Hotelling et al. | |

(56) References Cited

U.S. PATENT DOCUMENTS

| | | | |
|---|---|---|---|
| 2008/0007539 A1* | 1/2008 | Hotelling | 345/173 |
| 2008/0012837 A1 | 1/2008 | Marriott et al. | |
| 2008/0018615 A1 | 1/2008 | Zadesky et al. | |
| 2008/0018616 A1 | 1/2008 | Lampell et al. | |
| 2008/0018617 A1 | 1/2008 | Ng et al. | |
| 2008/0036473 A1 | 2/2008 | Jansson | |
| 2008/0036734 A1 | 2/2008 | Forsblad et al. | |
| 2008/0048997 A1* | 2/2008 | Gillespie et al. | 345/174 |
| 2008/0060925 A1 | 3/2008 | Weber et al. | |
| 2008/0062141 A1 | 3/2008 | Chandhri | |
| 2008/0069412 A1 | 3/2008 | Champagne et al. | |
| 2008/0079699 A1 | 4/2008 | Mackey | |
| 2008/0087476 A1 | 4/2008 | Prest | |
| 2008/0088582 A1 | 4/2008 | Prest | |
| 2008/0088595 A1* | 4/2008 | Liu et al. | 345/173 |
| 2008/0088596 A1 | 4/2008 | Prest | |
| 2008/0088597 A1 | 4/2008 | Prest | |
| 2008/0088600 A1 | 4/2008 | Prest | |
| 2008/0094352 A1 | 4/2008 | Tsuk et al. | |
| 2008/0098330 A1 | 4/2008 | Tsuk et al. | |
| 2008/0110739 A1 | 5/2008 | Peng et al. | |
| 2008/0111795 A1 | 5/2008 | Bollinger | |
| 2008/0143681 A1 | 6/2008 | XiaoPing | |
| 2008/0143683 A1* | 6/2008 | Hotelling | 345/173 |
| 2008/0158145 A1 | 7/2008 | Westerman | |
| 2008/0158181 A1* | 7/2008 | Hamblin et al. | 345/173 |
| 2008/0165141 A1 | 7/2008 | Christie | |
| 2008/0165158 A1 | 7/2008 | Hotelling et al. | |
| 2008/0196945 A1 | 8/2008 | Konstas | |
| 2008/0202824 A1 | 8/2008 | Philipp et al. | |
| 2008/0209442 A1 | 8/2008 | Setlur et al. | |
| 2008/0264767 A1 | 10/2008 | Chen et al. | |
| 2008/0280651 A1 | 11/2008 | Duarte | |
| 2008/0284742 A1 | 11/2008 | Prest | |
| 2008/0293274 A1 | 11/2008 | Milan | |
| 2009/0021267 A1 | 1/2009 | Golovchenko et al. | |
| 2009/0026558 A1 | 1/2009 | Bauer et al. | |
| 2009/0033635 A1 | 2/2009 | Wai | |
| 2009/0036176 A1 | 2/2009 | Ure | |
| 2009/0058687 A1 | 3/2009 | Rothkopf et al. | |
| 2009/0058801 A1 | 3/2009 | Bull | |
| 2009/0058802 A1 | 3/2009 | Orsley et al. | |
| 2009/0073130 A1 | 3/2009 | Weber et al. | |
| 2009/0078551 A1 | 3/2009 | Kang | |
| 2009/0109181 A1 | 4/2009 | Hui et al. | |
| 2009/0141046 A1 | 6/2009 | Rathnam et al. | |
| 2009/0160771 A1 | 6/2009 | Hinckley et al. | |
| 2009/0167699 A1* | 7/2009 | Rosenblatt et al. | 345/173 |
| 2009/0179854 A1 | 7/2009 | Weber et al. | |
| 2009/0197059 A1 | 8/2009 | Weber et al. | |
| 2009/0229892 A1 | 9/2009 | Fisher et al. | |
| 2009/0273573 A1 | 11/2009 | Hotelling | |
| 2010/0058251 A1 | 3/2010 | Rottler et al. | |
| 2010/0060568 A1 | 3/2010 | Fisher et al. | |
| 2010/0149127 A1 | 6/2010 | Fisher et al. | |
| 2010/0289759 A1 | 11/2010 | Fisher et al. | |
| 2010/0313409 A1 | 12/2010 | Weber et al. | |
| 2011/0005845 A1 | 1/2011 | Hotelling et al. | |
| 2012/0255850 A1* | 10/2012 | Shimizu | 200/600 |

FOREIGN PATENT DOCUMENTS

| | | |
|---|---|---|
| CN | 1461943 | 12/2003 |
| CN | 1472519 | 2/2004 |
| CN | 1472520 | 2/2004 |
| CN | 1479858 | 3/2004 |
| CN | 1720431 | 1/2006 |
| DE | 3615742 | 11/1987 |
| DE | 19722636 | 12/1998 |
| DE | 10022537 | 11/2000 |
| DE | 20019074 U1 | 2/2001 |
| DE | 10 2004 043 663 | 4/2006 |
| EP | 0178157 | 4/1986 |
| EP | 0419145 A1 | 3/1991 |
| EP | 0 498 540 | 8/1992 |
| EP | 0 521 683 | 1/1993 |
| EP | 0 674 288 | 9/1995 |
| EP | 0 731 407 | 9/1996 |
| EP | 0 551 778 B1 | 1/1997 |
| EP | 0 877 256 | 11/1998 |
| EP | 0 880 091 A2 | 11/1998 |
| EP | 1 026 713 | 8/2000 |
| EP | 1 081 922 A2 | 3/2001 |
| EP | 1 098 241 A2 | 5/2001 |
| EP | 1 133 057 | 9/2001 |
| EP | 1 162 826 A2 | 12/2001 |
| EP | 1 168 396 | 1/2002 |
| EP | 1 205 836 A2 | 5/2002 |
| EP | 1 244 053 | 9/2002 |
| EP | 1 251 455 A2 | 10/2002 |
| EP | 1263193 | 12/2002 |
| EP | 1347481 | 9/2003 |
| EP | 1376326 | 1/2004 |
| EP | 1 467 392 | 10/2004 |
| EP | 1 482 401 | 12/2004 |
| EP | 1 496 467 | 1/2005 |
| EP | 1 517 228 | 3/2005 |
| EP | 1 542 437 A2 | 6/2005 |
| EP | 1 589 407 | 10/2005 |
| EP | 1 784 058 A2 | 5/2007 |
| EP | 1 841 188 | 10/2007 |
| EP | 1850218 | 10/2007 |
| EP | 1 876 711 | 1/2008 |
| FR | 2 686 440 | 7/1993 |
| GB | 2015167 | 9/1979 |
| GB | 2072389 | 9/1981 |
| GB | 2315186 | 1/1998 |
| GB | 2333215 | 7/1999 |
| GB | 2391060 | 1/2004 |
| GB | 2 402 105 | 12/2004 |
| JP | 57-95722 | 6/1982 |
| JP | 57-97626 | 6/1982 |
| JP | 61-117619 | 6/1986 |
| JP | 61-124009 | 6/1986 |
| JP | 63-20411 | 1/1988 |
| JP | 63-106826 | 5/1988 |
| JP | 63-181022 | 7/1988 |
| JP | 63-298518 | 12/1988 |
| JP | 03-57617 | 6/1991 |
| JP | 3-192418 | 8/1991 |
| JP | 04-32920 | 2/1992 |
| JP | 4-205408 | 7/1992 |
| JP | 5-041135 | 2/1993 |
| JP | 5-101741 | 4/1993 |
| JP | 54080938 | 4/1993 |
| JP | 5-36623 | 5/1993 |
| JP | 5-189110 | 7/1993 |
| JP | 5-205565 | 8/1993 |
| JP | 5-211021 | 8/1993 |
| JP | 5-217464 | 8/1993 |
| JP | 5-233141 | 9/1993 |
| JP | 5-262276 | 10/1993 |
| JP | 5-265656 | 10/1993 |
| JP | 5-274956 | 10/1993 |
| JP | 5-289811 | 11/1993 |
| JP | 5-298955 | 11/1993 |
| JP | 5-325723 | 12/1993 |
| JP | 6-20570 | 1/1994 |
| JP | 6-084428 | 3/1994 |
| JP | 6-089636 | 3/1994 |
| JP | 6-96639 | 4/1994 |
| JP | 6-111695 | 4/1994 |
| JP | 6-139879 | 5/1994 |
| JP | 6-187078 | 7/1994 |
| JP | 6-208433 | 7/1994 |
| JP | 6-267382 | 9/1994 |
| JP | 6-283993 | 10/1994 |
| JP | 6-333459 | 12/1994 |
| JP | 7-107574 | 4/1995 |
| JP | 7-41882 | 7/1995 |
| JP | 7-201249 | 8/1995 |
| JP | 7-201256 | 8/1995 |
| JP | 7-253838 | 10/1995 |

(56) References Cited

FOREIGN PATENT DOCUMENTS

| | | |
|---|---|---|
| JP | 7-261899 | 10/1995 |
| JP | 7-261922 | 10/1995 |
| JP | 7-296670 | 11/1995 |
| JP | 7-319001 | 12/1995 |
| JP | 8-016292 | 1/1996 |
| JP | 8-115158 | 5/1996 |
| JP | 8-203387 | 8/1996 |
| JP | 8-293226 | 11/1996 |
| JP | 8-298045 | 11/1996 |
| JP | 8-299541 | 11/1996 |
| JP | 8-316664 | 11/1996 |
| JP | 9-044289 | 2/1997 |
| JP | 9-069023 | 3/1997 |
| JP | 9-128148 | 5/1997 |
| JP | 9-134248 | 5/1997 |
| JP | 9-218747 | 8/1997 |
| JP | 9-230993 | 9/1997 |
| JP | 9-231858 | 9/1997 |
| JP | 9-233161 | 9/1997 |
| JP | 9-251347 | 9/1997 |
| JP | 9-258895 | 10/1997 |
| JP | 9-288926 | 11/1997 |
| JP | 10-63467 | 3/1998 |
| JP | 10-74127 | 3/1998 |
| JP | 10-074429 | 3/1998 |
| JP | 10-198507 | 7/1998 |
| JP | 10-227878 | 8/1998 |
| JP | 10-240693 | 9/1998 |
| JP | 10-320322 | 12/1998 |
| JP | 10-326149 | 12/1998 |
| JP | 11-24834 | 1/1999 |
| JP | 11-184607 | 7/1999 |
| JP | 11-194863 | 7/1999 |
| JP | 11-194872 | 7/1999 |
| JP | 11-194882 | 7/1999 |
| JP | 11-194883 | 7/1999 |
| JP | 11-194891 | 7/1999 |
| JP | 11-195353 | 7/1999 |
| JP | 11-203045 | 7/1999 |
| JP | 11-212725 | 8/1999 |
| JP | 11-272378 | 10/1999 |
| JP | 11-338628 | 12/1999 |
| JP | 2000-200147 | 7/2000 |
| JP | 2000-215549 | 8/2000 |
| JP | 2000-267777 | 9/2000 |
| JP | 2000-267786 | 9/2000 |
| JP | 2000-267797 | 9/2000 |
| JP | 2000-353045 | 12/2000 |
| JP | 2001-11769 | 1/2001 |
| JP | 2001-22508 | 1/2001 |
| JP | 2001-184158 | 7/2001 |
| JP | 3085481 | 2/2002 |
| JP | 2002-215311 | 8/2002 |
| JP | 2003-015796 | 1/2003 |
| JP | 2003-060754 | 2/2003 |
| JP | 2003-099198 | 4/2003 |
| JP | 2003-150303 | 5/2003 |
| JP | 2003-517674 | 5/2003 |
| JP | 2003-280799 | 10/2003 |
| JP | 2003-280807 | 10/2003 |
| JP | 2004-362097 | 12/2004 |
| JP | 2005-251218 | 9/2005 |
| JP | 2005-285140 | 10/2005 |
| JP | 2005-293606 | 10/2005 |
| JP | 2006-004453 | 1/2006 |
| JP | 2006-178962 | 7/2006 |
| JP | 3852854 | 12/2006 |
| JP | 2007-123473 | 5/2007 |
| KR | 1998-71394 | 10/1998 |
| KR | 1999-50198 | 7/1999 |
| KR | 2000-0008579 | 2/2000 |
| KR | 2001-108361 | 12/2001 |
| KR | 2002-65059 | 8/2002 |
| KR | 10-2006-0021678 | 3/2006 |
| TW | 431607 | 4/2001 |
| TW | 00470193 | 12/2001 |
| TW | 547716 | 8/2003 |
| WO | WO-94/17494 | 8/1994 |
| WO | WO-95/00897 A1 | 1/1995 |
| WO | WO-96/27968 | 9/1996 |
| WO | WO 98/14863 | 4/1998 |
| WO | WO-99/49443 | 9/1999 |
| WO | WO-00/79772 | 12/2000 |
| WO | WO-01/02949 | 1/2001 |
| WO | WO-01/44912 | 6/2001 |
| WO | WO-02/08881 | 1/2002 |
| WO | WO-03/044645 | 5/2003 |
| WO | WO 03/044956 | 5/2003 |
| WO | WO-03/025960 | 9/2003 |
| WO | WO 03/088176 | 10/2003 |
| WO | WO 03/090008 | 10/2003 |
| WO | WO-2004/001573 | 12/2003 |
| WO | WO 2004/040606 | 5/2004 |
| WO | WO-2004/091956 | 10/2004 |
| WO | WO-2005/055620 | 6/2005 |
| WO | WO 2005/076117 | 8/2005 |
| WO | WO-2005/114369 | 12/2005 |
| WO | WO 2005/124526 | 12/2005 |
| WO | WO-2006/020305 | 2/2006 |
| WO | WO-2006/021211 A2 | 3/2006 |
| WO | WO 2006/037545 | 4/2006 |
| WO | WO 2006/104745 | 10/2006 |
| WO | WO-2006/135127 | 12/2006 |
| WO | WO 2007/025858 | 3/2007 |
| WO | WO-2007/078477 | 7/2007 |
| WO | WO-2007/084467 | 7/2007 |
| WO | WO-2007/089766 | 8/2007 |
| WO | WO-2008/007372 | 1/2008 |
| WO | WO-2008/045414 | 4/2008 |
| WO | WO-2008/045833 | 4/2008 |

OTHER PUBLICATIONS

Robbin et al., U.S. Office Action mailed Aug. 10, 2009, directed to U.S. Appl. No. 11/610,376; 11 pages.
Robbin et al., U.S. Office Action mailed Aug. 12, 2009, directed to U.S. Appl. No. 11/610,384; 20 pages.
Hotelling, U.S. Office Action mailed Sep. 1, 2009, directed to U.S. Appl. No. 11/482,286; 14 pages.
Lampell, U.S. Office Action mailed Sep. 15, 2009, directed to U.S. Appl. No. 11/530,807; 15 pages.
Boling, Douglas (1993) "Programming Microsoft Windows CE.NET," p. 109.
Zadesky et al, U.S. Office Action mailed Feb. 1, 2011, directed to U.S. Appl. No. 11/882,004, 16 pages.
Bull, U.S. Office Action mailed Feb. 4, 2011, directed to U.S. Appl. No. 11/849,801; 22 pages.
Weber et al, U.S. Office Action mailed Jan. 7, 2011, directed to U.S. Appl. No. 11/856,530; 13 pages.
Weber et al., U.S. Office Action mailed Jan. 7, 2011, directed to U.S. Appl. No. 12/205,795; 21 pages.
Weber et al., U.S. Office Action mailed Feb. 17, 2011, directed to U.S. Appl. No. 12/844,502; 11 pages.
Tsuk et al., U.S. Office Action mailed Apr. 19, 2011, directed to U.S. Appl. No. 11/610,190; 25 pages.
Tsuk et al., U.S. Office Action mailed Mar. 31, 2011, directed to U.S. Appl. No. 11/959,918; 9 pages.
Robbin et al., U.S. Office Action mailed Apr. 26, 2011, directed to U.S. Appl. No. 11/838,845; 9 pages.
Zadesky et al., U.S. Office Action mailed Mar. 31, 2011, directed to U.S. Appl. No. 11/882,005; 7 pages.
Bollinger et al., U.S. Office Action mailed Mar. 21, 2011, directed to U.S. Appl. No. 11/842,724; 22 pages.
McKillop et al., U.S. Office Action mailed Mar. 24, 2011, directed to U.S. Appl. No. 11/591,752; 11 pages.
Zadesky et al., U.S. Office Action mailed Mar. 16, 2011, directed to U.S. Appl. No. 11/882,003; 12 pages.
Rathnam et al., U.S. Office Action mailed Mar. 24, 2011, directed to U.S. Appl. No. 12/205,757; 14 pages.
Ng et al., U.S. Office Action mailed Jul. 8, 2010, directed to U.S. Appl. No. 11/882,423; 19 pages.

(56) References Cited

OTHER PUBLICATIONS

Robbin et al., U.S. Appl. No. 60/387,692 entitled "Method and Apparatus for Use of Rotational User Inputs," filed Jun. 10, 2002.
Robbin et al., U.S. Appl. No. 60/399,806 entitled "Graphical User Interface and Methods of Use Thereof in a Multimedia Player," filed Jul. 30, 2002.
Tsuk et al., U.S. Office Action mailed Oct. 13, 2006, directed to U.S. Appl. No. 10/256,716; 16 pages.
Tsuk et al., U.S. Office Action mailed Aug. 3, 2006, directed to U.S. Appl. No. 10/256,716; 15 pages.
Tsuk et al., U.S. Office Action mailed Jan. 10, 2006, directed to U.S. Appl. No. 10/256,716; 12 pages.
Tsuk et al., U.S. Office Action mailed Jun. 24, 2005, directed to U.S. Appl. No. 10/256,716; 12 pages.
Tsuk et al., U.S. Office Action mailed Sep. 30, 2004, directed to U.S. Appl. No. 10/256,716; 11 pages.
Tsuk et al., U.S. Office Action mailed Jul. 7, 2009, directed to U.S. Appl. No. 11/610,190; 24 pages.
Robbin et al., U.S. Office Action mailed Jan. 18, 2007, directed to U.S. Appl. No. 10/259,159; 18 pages.
Robbin et al., U.S. Office Action mailed Oct. 13, 2006, directed to U.S. Appl. No. 10/259,159; 18 pages.
Robbin et al., U.S. Office Action mailed Aug. 3, 2006, directed to U.S. Appl. No. 10/259,159; 15 pages.
Robbin et al., U.S. Office Action mailed Jan. 11, 2006, directed to U.S. Appl. No. 10/259,159; 15 pages.
Robbin et al., U.S. Office Action mailed Jun. 16, 2005, directed to U.S. Appl. No. 10/259,159; 16 pages.
Robbin et al., U.S. Office Action mailed Sep. 30, 2004, directed to U.S. Appl. No. 10/259,159; 14 pages.
Zadesky et al., U.S. Office Action mailed Jul. 9, 2008, directed to U.S. Appl. No. 10/643,256; 12 pages.
Zadesky et al., U.S. Office Action mailed Dec. 12, 2007, directed to U.S. Appl. No. 10/643,256; 12 pages.
Zadesky et al., U.S. Office Action mailed Jul. 13, 2007, directed to U.S. Appl. No. 10/643,256; 13 pages.
Zadesky et al., U.S. Office Action mailed Mar. 23, 2007, directed to U.S. Appl. No. 10/643,256; 11 pages.
Zadesky et al., U.S. Office Action mailed Oct. 27, 2006, directed to U.S. Appl. No. 10/643,256; 14 pages.
Forsblad et al., U.S. Office Action mailed Jun. 25, 2009, directed to U.S. Appl. No. 11/355,022; 18 pages.
Forsblad et al., U.S. Office Action mailed Jan. 26, 2009, directed to U.S. Appl. No. 11/355,022; 15 pages.
Hotelling et al., U.S. Office Action mailed Jan. 27, 2009, directed to U.S. Appl. No. 11/882,421; 15 pages.
Zadesky et al., U.S. Office Action mailed Aug. 6, 2009, directed to U.S. Appl. No. 11/057,050; 30 pages.
Zadesky et al., U.S. Office Action mailed Feb. 20, 2009, directed to U.S. Appl. No. 11/057,050; 25 pages.
Zadesky et al., U.S. Office Action mailed Dec. 24, 2008, directed to U.S. Appl. No. 11/057,050; 25 pages.
Zadesky et al., U.S. Office Action mailed Nov. 26, 2008, directed to U.S. Appl. No. 11/057,050; 25 pages.
Zadesky et al, U.S. Office Action mailed Aug. 19, 2008, directed to U.S. Appl. No. 11/057,050; 23 pages.
Zadesky et al., U.S. Office Action mailed Nov. 20, 2007, directed to U.S. Appl. No. 11/057,050; 33 pages.
Zadesky et al., U.S. Office Action mailed Mar. 5, 2009, directed to U.S. Appl. No. 11/477,469; 12 pages.
Zadesky et al., U.S. Office Action mailed Jul. 30, 2004, directed to U.S. Appl. No. 10/188,182; 7 pages.
Zadesky et al., U.S. Office Action mailed Sep. 21, 2005, directed to U.S. Appl. No. 10/188,182; 10 pages.
Zadesky et al., U.S. Office Action mailed Mar. 4, 2004, directed to U.S. Appl. No. 10/188,182; 8 pages.
Zadesky et al., U.S. Office Action mailed Oct. 4, 2007, directed to U.S. Appl. No. 11/386,238; 12 pages.
Zadesky et al.., U.S. Office Action mailed Oct. 4, 2007, directed to U.S. Appl. No. 11/806,957; 14 pages.
Marriott et al., U.S. Office Action mailed Jan. 30, 2008, directed to U.S. Appl. No. 10/722,948; 17 pages.
Marriott et al., U.S. Office Action mailed Jul. 13, 2007, directed to U.S. Appl. No. 10/722,948; 15 pages.
Marriott et al., U.S. Office Action mailed Dec. 12, 2006, directed to U.S. Appl. No. 10/722,948; 14 pages.
Marriott et al., U.S. Office Action mailed Jun. 2, 2006, directed to U.S. Appl. No. 10/722,948; 12 pages.
Hotelling et al., U.S. Office Action mailed Jul. 24, 2009, directed to U.S. Appl. No. 11/483,008; 17 pages.
Hotelling et al., U.S. Office Action mailed Jul. 27, 2009, directed to U.S. Appl. No. 11/882,420; 17 pages.
Elias et al., U.S. Office Action mailed Aug. 4, 2009, directed to U.S. Appl. No. 11/203,692; 12 pages.
Elias et al., U.S. Office Action mailed Feb. 23, 2009, directed to U.S. Appl. No. 11/203,692; 13 pages.
Elias et al., U.S. Office Action mailed Sep. 17, 2008, directed to U.S. Appl. No. 11/203,692; 8 pages.
Lynch et al., U.S. Office Action mailed Oct. 5, 2009, directed to U.S. Appl. No. 11/499,360; 7 pages.
Lynch et al., U.S. Office Action mailed Jan. 27, 2010, directed to U.S. Appl. No. 11/499,360; 8 pages.
Ng et al., U.S. Office Action mailed Jan. 14, 2010, directed to U.S. Appl. No. 11/394,493; 20 pages.
Ng et al., U.S. Office Action mailed Jan. 15, 2010, directed to U.S. Appl. No. 11/882,423; 22 pages.
Tsuk et al., U.S. Office Action mailed Dec. 31, 2009, directed to U.S. Appl. No. 11/610,190; 25 pages.
Zadesky et al., U.S. Office Action mailed Feb. 4, 2010, directed to U.S. Appl. No. 11/477,469; 14 pages.
Hotelling, U.S. Office Action mailed Jan. 25, 2010, directed to U.S. Appl. No. 11/482,286; 17 pages.
Interlink Electronics, VersaPad: Integration Guide, ©1998 (VersaPad), pp. 1-35.
Letter re: Bang & Olufsen a/s by David Safran, Nixon Peabody, LLP, May 21, 2004, with BeoCom 6000 Sales Training Brochure, 7 pages.
Kobayashi et al. (1994) "Development of the Touch Switches with the Click Response," Koukuu Denshi Gihou No. 17, pp. 44-48 (published by the Japan Aviation Electronics Industry, Ltd.)
Photographs of Innovation 2000 Best of Show Award Presented at the 2000 Int'l CES Innovations Design & Engineering Showcase, Jan. 6, 2000, 1 page.
SanDisk Sansa Connect User Guide, 2007; 29 pages.
Tsuk et al., U.S. Office Action mailed Apr. 28, 2010, directed to U.S. Appl. No. 11/610,190; 29 pages.
Zadesky et al., U.S. Office Action mailed Mar. 30, 2010, directed to U.S. Appl. No. 11/592,679; 13 pages.
Hotelling et al., U.S. Office Action mailed Mar. 30, 2010, directed to U.S. Appl. No. 11/483,008; 20 pages.
Elias et al., U.S. Office Action mailed Mar. 30, 2010, directed to U.S. Appl. No. 11/203,692; 15 pages.
CN Notification for Making Corrections dated Apr. 22, 2010, directed to corresponding application No. 200920179495.3; 3 pages.
ISR and Written Opinion mailed Jun. 1, 2010, directed to counterpart PCT/US2009/058054; 13 pages.
Ng et al., U.S. Office Action mailed Jun. 22, 2010, directed to U.S. Appl. No. 11/394,493; 14 pages.
Lampell, U.S. Office Action mailed Jun. 4, 2010, directed to U.S. Appl. No. 11/530,807; 15 pages.
Prest et al., U.S. Office Action mailed Jun. 22, 2010, directed to U.S. Appl. No. 11/878,132; 32 pages.
Prest et al., U.S. Office Action mailed Jun. 22, 2010, directed to U.S. Appl. No. 11/882,882; 32 pages.
Prest et al., U.S. Office Action mailed Jun. 23, 2010, directed to U.S. Appl. No. 11/812,384; 29 pages.
Prest et al., U.S. Office Action mailed Jun. 22, 2010, directed to U.S. Appl. No. 11/882,890; 15 pages.
Prest et al., U.S. Office Action mailed Jun. 22, 2010, directed to U.S. Appl. No. 11/812,383; 21 pages.
Prest et al., U.S. Office Action mailed Jun. 23, 2010, directed to U.S. Appl. No. 11/882,889; 13 pages.
Bollinger et al., U.S. Office Action mailed Jun. 25, 2010, directed to U.S. Appl. No. 11/842,724; 22 pages.

(56) References Cited

OTHER PUBLICATIONS

Hotelling, U.S. Office mailed Jun. 9, 2010, directed to U.S. Appl. No. 11/482,286; 21 pages.
Elias et al., U.S. Office Action mailed Jun. 11, 2010, directed to U.S. Appl. No. 11/203,692; 17 pages.
Weber et al., U.S. Office Action mailed Jun. 7, 2010, directed to U.S. Appl. No. 11/856,530; 15 pages.
Robbin, U.S. Appl. No. 60/346,237 entitled, "Method and System for List Scrolling," filed Oct. 22, 2001; 12 pages.
Zadesky et al., U.S. Appl. No. 60/359,551 entitled "Touchpad for Handheld Device," filed Feb. 25, 2002; 34 pages.
Elias et al., U.S. Appl. No. 60/522,107, filed Aug. 16, 2004, entitled, "A Method for Increasing the Spatial Resolution of Touch Sensitive Devices"; 15 pages.
Hotelling, U.S. Appl. No. 60/658,777 titled "Multi-Functional Handheld Device," filed Mar. 4, 2005; 68 pages.
Zadesky et al., U.S. Appl. No. 60/714,609 entitled "Scrolling Input Arrangements Using Capacitive Sensors on a Flexible Membrane," filed Sep. 6, 2005; 17 pages.
Grignon et al., U.S. Appl. No. 60/755,656, filed Dec. 30, 2005, entitled "Touch Pad with Feedback"; 109 pages.
Lampell et al., U.S. Appl. No. 60/810,423, filed Jun. 2, 2006, entitled "Techniques for Interactive Input to Portable Electronic Devices"; 53 pages.
Prest et al., U.S. Appl. No. 60/850,662, filed Oct. 11, 2006, entitled, "Capacitive Scroll Wheel"; 21 pages.
Bollinger, U.S. Appl. No. 60/858,404, filed Nov. 13, 2006, entitled "Method of Capacitively Sensing Finger Position"; 13 pages.
Rothkopf, U.S. Appl. No. 60/935,854, titled "Compact Media Players," filed Sep. 4, 2007; 36 pages.
Rathnam et al., U.S. Appl. No. 60/992,056, filed Dec. 3, 2007, entitled, "Scroll Wheel Circuit Arrangements and Methods of Use Thereof"; 42 pages.
Rathnam et al., U.S. Appl. No. 61/017,436, filed Dec. 28, 2007, entitled, "Multi-Touch Scroll Wheel Circuit Arrangements and Processing Methods"; 58 pages.
Weber et al., U.S. Appl. No. 61/020,531, filed Jan. 11, 2008 entitled "Modifiable Clickwheel Text"; 11 pages.
Weber et al., U.S. Appl. No. 61/025,531, filed Feb. 1, 2008 entitled "Co-Extruded Materials and Methods"; 11 pages.
Fisher et al., U.S. Appl. No. 61/036,804, filed Mar. 14, 2008 entitled "Switchable Sensor Configurations"; 46 pages.
Beaver et al., U.S. Appl. No. 12/042,318, filed Mar. 4, 2008 entitled, "Touch Event Model"; 36 pages.
IPRP mailed Sep. 27, 2010, directed to counterpart application No. PCT/US2009/058054; 12 pages.
Tsuk et al., U.S. Office Action mailed Nov. 1, 2010, directed to U.S. Appl. No. 11/959,918; 9 pages.
Tsuk et al., U.S. Office Action mailed Oct. 26, 2010, directed to U.S. Appl. No. 11/959,942; 27 pages.
Robbin et al., U.S. Office Action mailed Oct. 29, 2010, directed to U.S. Appl. No. 11/838,845; 8 pages.
Ng et al., U.S. Office Action mailed Oct. 26, 2010, directed to U.S. Appl. No. 11/882,423; 18 pages.
Zadesky et al., U.S. Office Action mailed Oct. 4, 2010, directed to U.S. Appl. No. 11/057,050; 31 pages.
McKillop et al., U.S. Office Action mailed Sep. 16, 2010, directed to U.S. Appl. No. 11/591,752; 14 pages.
Zadesky et al., U.S. Office Action mailed Sep. 29, 2010, directed to U.S. Appl. No. 11/882,003; 13 pages.
Hotelling, U.S. Office Action mailed Oct. 1, 2010, directed to U.S. Appl. No. 11/482,286; 28 pages.
Hotelling et al., U.S. Office Action mailed Oct. 27, 2010, directed to U.S. Appl. No. 11/483,008; 23 pages.
Weber et al., U.S. Office Action mailed Oct. 13, 2010, directed to U.S. Appl. No. 12/205,795; 15 pages.
"About Quicktip®" www.logicad3d.com/docs/qt.html, downloaded Apr. 8, 2002.
"Alps Electric Ships GlidePoint Keyboard for the Macintosh; Includes a GlidePoint Touchpad, Erase-Eaze Backspace Key and Contoured Wrist Rest," Business Wire (Jul. 1, 1996).
"Alps Electric introduces the GlidePoint Wave Keyboard; combines a gently curved design with Alps' advanced GlidePoint Technology," Business Wire (Oct. 21, 1996).
"Apple Presents iPod: Ultra-Portable MP3 Music Player Puts 1,000 Songs in Your Pocket," retreived from http://www.apple.com/pr/library/2001/oct/23ipod.html on Oct. 23, 2001.
"Apple Unveils Optical Mouse and New Pro Keyboard," Press Release, Jul. 19, 2000.
"APS show guide to exhibitors," Physics Today 49(3) (Mar. 1996).
"Atari VCS/2600 Peripherals," www.classicgaming.com/gamingmuseum/2006p.html, downloaded Feb. 28, 2007, pp. 1-15.
"Der Klangmeister," Connect Magazine, Aug. 1998.
"Design News literature plus," Design News 51(24) (Dec. 18, 1995).
"Neuros MP3 Digital Audio Computer," www.neurosaudio.com, downloaded Apr. 9, 2003.
"OEM Touchpad Modules" website www.glidepoint.com/sales/modules.index.shtml, downloaded Feb. 13, 2002.
"Product Overview—ErgoCommander®," www.logicad3d.com/products/ErgoCommander.htm, downloaded Apr. 8, 2002.
"Product Overview—SpaceMouse® Classic," www.logicad3d.com/products/Classic.htm, downloaded Apr. 8, 2002.
"System Service and Troubleshooting Manual," www.dsplib.com/intv/Master, downloaded Dec. 11, 2002.
"Synaptics Tough Pad Interfacing Guide," Second Edition, Mar. 25, 1998, Synaptics, Inc., San Jose, CA, pp. 1-90.
"Triax Custom Controllers due; Video Game Controllers," HFD—The Weekly Home Furnishing Newspaper 67(1) (Jan. 4, 1993).
Ahl, David, "Controller Update," Creative Computing Vo. 9, No. 12, Dec. 1983.
Ahmad, "A Usable Real-Time 3D Hand Tracker," Proceedings of the 28th Asilomar Conference on Signals, Systems and Computers—Part 2 (of 2) vol. 2 (Oct. 1994).
Baig, E.C., "Your PC Just Might Need a Mouse," U.S News & World Report 108(22) (Jun. 4, 1990).
Bang & Olufsen Telecom a/s, "BeoCom 6000 User Guide 2000."
Bartimo, Jim, "The Portables: Travelling Quickly," Computerworld (Nov. 14, 1983).
BeoCom 6000, Sales Training Brochure, date unknown.
Bray, "Phosphors help switch on xenon," Physics in Action, pp. 1-3, Apr. 1999.
Brink et al., "Pumped-up portables," U.S. News & World Report 116(21) (May 30, 1994).
Brown et al., "Windows on Tablets as a Means of Achieving Virtual Input Devices," Human-Computer Interaction—Interact '90 (1990).
Buxton et al., "Issues and Techniques in Touch-Sensitive Tablet Input," Computer Graphics 19(3), Proceedings of SIGGRAPH '85 (1985).
Chapweske, Adam "PS/2 Mouse/Keyboard Protocol," 1999, http://panda.cs.ndsu.nodak.edu/~achapwes/PICmicro/PS2/ps2.htm.
Chen et al., "A Study in Interactive 3-D Rotation Using 2-D Control Devices," Computer Graphics 22(4) (Aug. 1988).
Chinese Office Action issue Dec. 29, 2006, directed to CN Application No. 200510103886.3, 25 pages.
De Meyer, Kevin, "Crystal Optical Mouse," Feb. 14, 2002, Heatseekerz, Web Article 19.
Evans et al., "Tablet-based Valuators that Provide One, Two, or Three Degrees of Freedom," Computer Grahics 15(3) (Aug. 1981).
Evb Elektronik "TSOP6238 IR Receiver Modules for Infrared Remote Control Systems" dated Jan. 2004 1 page.
Fiore, "Zen Touchpad," Cornell University, May 2000.
Gadgetboy, "Point and click with the latest mice,"CNET Asia Product Review, www.asia.cnet.com/reviews...are/gadgetboy/0,39001770,380235900,00.htm, downloaded Dec. 5, 2001.
Gfroerer, "Photoluminescence in Analysis of Surfaces and Interfaces," Encyclopedia of Analytical Chemistry, pp. 1-23, Copyright John Wiley & Sons Ltd, Chichester, 2000.
Jesitus, John, "Broken promies?", Industry Week/IW 246(20) (Nov. 3, 1997).
Kobayashi (1996) "Design of Dynamic Soundscape: Mapping Time to Space for Audio Browsing with Simultaneous Listening," Thesis

(56) References Cited

OTHER PUBLICATIONS submitted to Program in Media Arts and Sciences at the Massachusetts Institute of Technology, (58 pages).
Kobayashi et al. (1997) "Dynamic Soundscape: Mapping Time to Space for Audio Browsing," Computer Human Interaction: 16 pages.
Kobayashi et al. "Development of the Touch Switches with the Click Response," Koukuu Denshi Gihou No. 17, pp. 44-48 (Mar. 1994) (published by the Japan Aviation Electronics Industry, Ltd.)
Letter re: Bang & Olufsen a/s by David Safran, Nixon Peabody, LLP May 21, 2004.
Luna Technologies International, Inc., LUNA Photoluminescent Safety Products, "Photoluminescence—What is Photoluminescence?" from website at http://www.lunaplast.com/photoluminescence.com on Dec. 27, 2005.
"Manufactures," Laser Focus World, Buyers Guide '96; 31(12) (Dec. 1995).
Mims, Forrest M., III, "A Few Quick Pointers; Mouses, Touch Screens, Touch Pads, Light Pads, and The Like Can Make System Easier to Use," Computers & Electronics (22) (May 1984).
Nass, Richard, "Touchpad input device goes digital to give portable systems a desktop 'mouse-like' feel," Electronic Design 44(18) (Sep. 3, 1996).
"National Design Engineering Show," Design News 52(5) (Mar. 4, 1996).
Perenson, Melissa, "New & Improved: Touchpad Redux," PC Magazine (Sep. 10, 1996).
Petersen, Marty, "Koala Pad Touch Tablet & Micro Illustrator Software," InfoWorld (Oct. 10, 1983).
Petruzzellis, "Force-Sensing Resistors," Electronics Now 64(3) (Mar. 1993).
Photographs of Innovation 2000 Best of Show Award Presented at the 2000 Int'l CES Innovations 2000 Design & Engineering Showcase, 1 page.
"Preview of exhibitor booths at the Philadelphia show," Air Conditioning, Heating & News 200(2) (Jan. 13, 1997).
"Product news," Design News 53(9) (May 5, 1997).
"Product news," Design News 53(11) (Jun. 9, 1997).
Sony presents "Choice Without Compromise" at IBC '97 M2 PRESSWIRE (Jul. 24, 1997).
Spiwak, Marc, "A Great New Wireless Keyboard," Popular Electronics 14(12) (Dec. 1997).
Spiwak, Marc, "A Pair of Unusual Controllers," Popular Electronics 14(4) (Apr. 1997).
Soderholm, Lars G., "Sensing Systems for 'Touch and Feel'", Design News (May 8, 1989): pp. 72-76.
Sylvania, "Intellvision™ Intelligent Television Master Component Service Manual," pp. 1, 2 and 8, 1979.
Tessler, Franklin, "Point Pad," Macworld 12(10) (Oct. 1995).
Tessler, Franklin, "Touchpads," Macworld 13(2) (Feb. 1996).
Tessler, Franklin, "Smart Input: How to Chose from the New Generation of Innovative Input Devices," Macworld 13(5) (May 1996).
SanDisk Sansa Connect User Guide; 29 pages.
"Touchpad," Notebook PC Manual, ACER Information Co. Ltd., Feb. 16, 2005, pp. 11-12.
Translation of Trekstor's Defense Statement to the District Court Mannheim of May 23, 2008; 37 pages.
"Diamond Multimedia Announces Rio PMP300 Portable MP3 Music Player," located at http://news.harmony-central.com/Newp/1998/Rio-PMP300.html visited on May 5, 2008. (4 pages).
Chinese Office Action dated Oct. 21, 2011, directed to Chinese Application No. 200910177756.2; 21 pages.
Ng et al., U.S. Office Action mailed Dec. 9, 2010, directed to U.S. Appl. No. 11/394,493; 13 pages.
Zadesky et al., U.S. Office Action mailed Nov. 16, 2010, directed to U.S. Appl. No. 11/477,469; 13 pages.
Lampell, U.S. Office Action mailed Dec. 3, 2010, directed to U.S. Appl. No. 11/530,807; 17 pages.
Lampell et al., U.S. Office Action mailed Dec. 22, 2010, directed to U.S. Appl. No. 11/882,427; 16 pages.
Hotelling, U.S. Office Action mailed Dec. 8, 2010, directed to U.S. Appl. No. 11/482,286; 33 pages.
Elias et al., U.S. Office Action mailed Nov. 22, 2010, directed to U.S. Appl. No. 11/203,692; 6 pages.
Tsuk et al., U.S. Office Action mailed Aug. 6, 2010, directed to U.S. Appl. No. 11/610,190; 30 pages.
Zadesky et al., U.S. Office Action mailed Aug. 2, 2010, directed to U.S. Appl. No. 11/882,004; 9 pages.
Marriott et al., U.S. Office Action mailed Aug. 19, 2010, directed to U.S. Appl. No. 11/882,422; 13 pages.
Hotelling, U.S. Office Action mailed Aug. 18, 2010, directed to U.S. Appl. No. 11/882,424; 16 pages.
Bull, U.S. Office Action mailed Jul. 9, 2010, directed to U.S. Appl. No. 11/849,801; 13 pages.
Search Report dated Nov. 28, 2011, directed to Chinese Patent No. ZL2009201794953; 11 pages.
Office Action dated Jul. 6, 2012, directed to Mexican Application No. MX/a/2011/003206; 2 pages.
Second Office Action dated Jul. 23, 2012, directed to Chinese Application No. 200910177756.2; 10 pages.
Australian Office Action mailed Apr. 2, 2012, directed to Australian Application No. 2009296745; 2 pages.
Extended Search Report dated Oct. 9, 2012, directed towards EP Application No. 12172976.8; 6 pages.
Office Action dated Mar. 25, 2013, directed to MX Application No. MX/a/2011/003206; 2 pages.
Office Action mailed Nov. 12, 2013, directed to MX Application No. MX/a/2011/003206; 6 pages.

\* cited by examiner

CAPACITIVE SENSOR HAVING ELECTRODES ARRANGED ON THE SUBSTRATE AND THE FLEX CIRCUIT

BACKGROUND

1. Field

This disclosure relates to input devices, and more particularly to a capacitive sensor of an input device.

2. Description of the Related Art

Several kinds of input devices exist for performing operations in a computing device. Some examples of input devices include buttons, switches, keyboards, mice, trackballs, touch pads, joy sticks, touch screens and the like. Some examples of computing devices include personal computers, media players, remote controls, personal digital assistants (PDAs), cellular phones, etc. Operations performed by the input devices generally may include, for example, moving a cursor to select items displayed on a display screen of the computing devices or browsing through a list of audio files to select an audio file for play.

As computing devices evolve, they tend to decrease in size while providing increased features. In light of this, designing input devices for these computing devices can present unique issues.

For example, a touch screen input device that includes an array of capacitive electrodes arranged within a conductive range with an object touching the screen. As the size of the portable computing device decreasing, the space available for the placement of the electrodes typically decreases. For example, as the circuit components are packed more tightly together, it is often needed to utilize all space available on a circuit board. Thus, the conventional placement of the electrodes within a single layer may be problematic where an area of the layer needs to be used for other device modules, e.g., a video processor or sound card, or where the layer physically interferes with other components of the device such as, for example, an input receptacle. Accordingly, the design of input devices for such devices can be constrained by efforts to conserve a limited amount of space.

SUMMARY

This disclosure relates, in one embodiment, to a capacitive sensor. The capacitive sensor may include a flex circuit and a substrate. The substrate may be facing the surface of the flex circuit and made of glass material, plastic material, ceramics, or polyethylene terephthalate (PET) material, etc. In an exemplary embodiment, the substrate material has a sheet resistance less than 100 ohms/square area. The capacitive sensor also includes at least one electrode formed on the substrate and at least one electrode formed on the flex circuit. The former electrode may be painted, printed, or sputtered on the substrate.

In one embodiment, the flex circuit may include a notch. The notch may include an area that has been cut out of the flex circuit, is occupied by another circuit module, or is otherwise unavailable for placement of electrodes on the flex circuit. To construct a continuous arrangement of electrodes, an electrode is formed on the substrate overlapping the area of the notch to supplement the electrodes arranged on the flex circuit.

According to a further embodiment, the electrodes may be arranged as a first set of electrodes arranged in a first linear arrangement and a second set of electrodes arranged in a second linear arrangement. For example, the electrodes may be arranged in rows and columns. All the electrodes within each row may be electrically connected to each other and all the electrodes within each column may be electrically connected to each other. On an area of the substrate overlapping the notch of the flex circuit, at least one electrode may be arranged to line up with and electrically couple to one or more of the electrodes of the flex circuit.

According to an embodiment, the flex circuit may include an array of electrodes. Each electrode may be coupled individually to a trace arranged on the lower surface of the substrate such that an input applied to any single electrode can be identified. The flex circuit may include a notch. A set of electrodes may thus be formed on the substrate above the notch to supplement the electrode arrangement of the flex circuit in a continuous pattern.

According to yet another embodiment, the electrodes may be grouped into a first set of electrodes arranged in a first linear arrangement on the flex circuit and a second set of electrodes arranged in a second linear arrangement on the substrate. For example, the electrodes may be arranged as rows formed on a surface of the flex circuit and in columns formed on an opposite surface of the substrate, or vice versa. A layer of insulating material may also be formed between the rows and the columns. In this embodiment, the row electrodes and column electrodes form a mutual capacitance similar to the above-described embodiment.

In yet another embodiment, the rows and columns of electrodes may be both formed on the flex circuit. An area of the flex circuit includes a notch as described above. Thus, in this embodiment, corresponding rows and columns are formed on an area of the substrate overlapping the notch in a pattern that is continuous with and electrically coupled to the arrangement of the rows and columns on the flex circuit. The rows and columns may be painted, printed, or sputtered on the substrate and may include a layer of insulating material therebetween.

According to another aspect, there is provided a computer device including a capacitive sensor as described in the aforementioned embodiments, coupled to a sensing unit that senses the location of a an input applied to the sensor.

According to yet another aspect, there is provided a method of manufacturing a capacitive sensor. The method may include, in one embodiment: forming at least one electrode associated with a substrate, forming at least one electrode associated with a flex circuit, and arranging the substrate and the flex circuit such that the electrodes are positioned between the substrate and the flex circuit.

BRIEF DESCRIPTION OF THE DRAWINGS

The embodiments are illustrated by way of example, not by way of limitation, in the figures of the accompanying drawings as follows:

FIG. 2b depicts an exemplary perspective view of a lower surface of a substrate arranged facing the flex circuit of FIG. 2a.

FIG. 2c depicts an exemplary perspective view of a lower surface of the flex circuit of FIG. 2a.

FIG. 3b depicts an exemplary perspective view of a lower surface of a substrate arranged facing the flex circuit of FIG. 3a.

FIG. 3c depicts an exemplary perspective view of a lower surface of the flex circuit of FIG. 3a.

FIG. 3d depicts an exemplary perspective view of a lower surface of another exemplary substrate arranged facing the flex circuit of FIG. 3a.

FIG. 5 depicts an exemplary perspective view of a lower surface of yet another exemplary substrate arranged facing the flex circuit of FIG. 3a.

FIG. 7b depicts an exemplary perspective view of a lower surface of a substrate arranged facing the flex circuit of FIG. 7a.

FIG. 10b depicts an exemplary perspective view of a lower surface of a substrate arranged facing the flex circuit of FIG. 10a.

DETAILED DESCRIPTION

Various embodiments are discussed below with reference to FIGS. 1a-12. However, those skilled in the art will readily appreciate that the detailed description given herein with respect to these figures is for explanatory purposes as the subject matter extends beyond these limited embodiments.

Figure 1A:
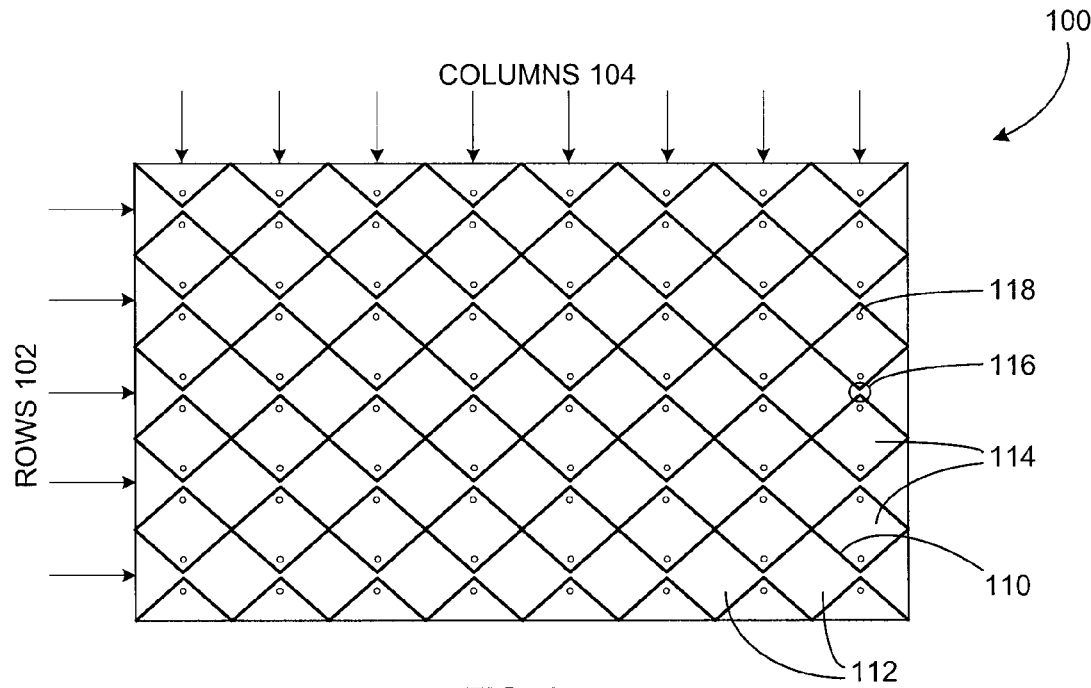
FIGS. 1a-1b depict exemplary perspective views of a flex circuit of a capacitive sensor having a double-diamond electrode pattern.

FIG. 1a depicts a perspective diagram of a flex circuit 100 of a capacitive sensor, according to an exemplary embodiment. The flex circuit 100 is a type of flexible circuit or flexible circuit board, such as a flexible high-performance plastic substrate, used for mounting electronic devices. Examples of a flex circuit 100 include a polyimide and polyetheretherketone (PEEK) film. The flex circuit 100 may be manufactured using identical components used for rigid printed circuit boards, allowing the board to conform to a desired shape, or to flex during its use.

The flex circuit 100 may include several rows 102 of row electrodes 112 and several columns 104 of column electrodes 114 arranged on a first surface of the flex circuit 100. The conductive electrodes 112, 114 may be arranged in a double-diamond pattern in which all row electrodes 112 are electrically connected within each row 102 and all column electrodes 114 are electrically connected within each column 104.

Figure 1B:
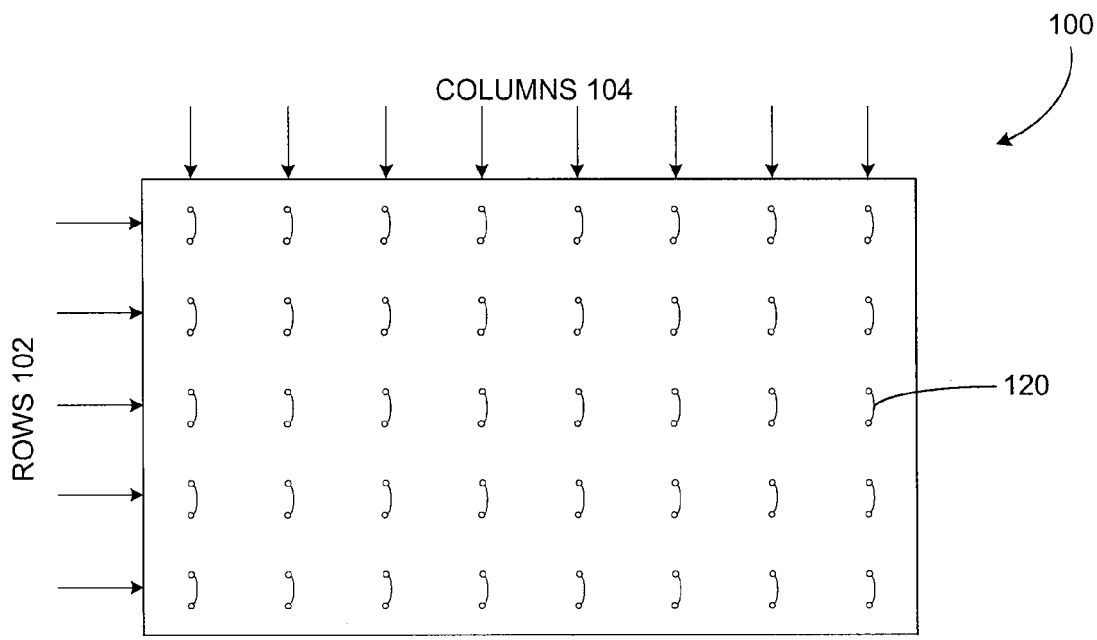

Two adjacent row electrodes 112 may be connected via an area 116 located between two intermediary column electrodes 114 in the vertical direction. The area 116 separates the two column electrodes 114, but includes conductive material to electrically connect the row electrodes 112. In an exemplary embodiment, the area 116 may be very small, e.g., 0.1 mm wide. The area 116 may be constructed such that it electrically isolates the column electrodes 114 in the vertical direction while electrically connecting the row electrodes 112. The column electrodes 114, which are separated by the areas 116, may be electrically connected via electrical patterns 120 arranged on a second surface of the flex circuit 100, as shown in FIG. 1b. The electrical patterns are coupled to the column electrodes via vias 118 through the flex circuit 100.

In addition to the flex circuit 100, the capacitive sensor may also include a substrate arranged facing the flex circuit 100. A first surface of the substrate constitutes the sensing surface of the capacitive sensor. This substrate may be made of different material such as, for example, glass, plastic, Polyethylene terephthalate (PET), ceramics, or other material. In an exemplary embodiment, the substrate material has a sheet resistance less than 100 ohms/square area. The substrate may be thin enough to allow objects, such as human fingertips, touching or coming in close proximity to its first surface to form a capacitance with the electrodes 112, 114.

The capacitive sensor may operate based on self capacitance, according to one embodiment. In self capacitance, the "self" capacitance of a single electrode is measured as, for example, relative to ground. In an exemplary embodiment, an input applied to the substrate, such as a finger touching or coming in close proximity of the surface of the substrate, may form the second plate of a two-plate capacitor. The finger effectively capacitively couples to the lower electrode, thus changing the capacitance of the electrode beneath the finger by some small amount. In some cases, the change in capacitance may be on the order of 1-2%. A controller or processor may continuously measure the capacitance of each electrode in the grid. When the controller or processor detects an increased capacitance in the electrode at a certain spot of the grid, the position of the finger is located. In an exemplary embodiment, each row and column of the electrodes may be continuously monitored to measure capacitances. A detailed description of self capacitance is provided in U.S. Application Publication No. 2006/0290677, which is incorporated herein by reference in its entirety.

According to an alternative embodiment, the capacitive sensor may operate based on mutual capacitance. In mutual capacitance, the mutual capacitance between at least two electrodes is measured. In an exemplary embodiment, each row electrode forms a mutual capacitance with its adjacent column electrodes. The rows are driven by a driving circuit periodically and the charges released from the row electrodes to the column electrodes are sensed on the column electrodes. When an input is applied to the surface, such as an finger touching or coming into close proximity of the surface, the application of the input to the surface takes away some of the charge that would have been released to the column electrode near the point of contact. Thus, by sensing the row being driven and the column carrying a smaller charge than expected, the position of touch of the fingertip can be determined.

The row electrodes 112 and the column electrodes 114 may be electrically isolated from each other by a separation 110 on the flex circuit 100. The separation 110 may include dielectric material to provide greater capacitance between the electrodes 112, 114 where the electrodes operate based on mutual capacitance. Where self capacitance is used, the separation 110 may include insulating material having a relatively high dielectric constant to minimize shorts between the electrodes 112, 114. Alternatively, the flex circuit 100 itself provides sufficient insulation between the respective electrodes.

According to an embodiment, when trying to reduce size of a computing device that includes the flex circuit 100 of FIG. 1a, the placement of all electrodes 112, 114 on the flex circuit 100 may interfere with other circuitry on the flex circuit 100. For example, a portion of the area of the first surface of the flex circuit 100 may be occupied by a circuit module in a way that the electrodes 102, 104 can not be placed directly on that area of the flex circuit 100. Also, in some circumstances, a portion of the flex circuit 100 may need to be utilized to make room for other device components. For example, in a compact multi-media device utilizing the flex circuit 100, it may be needed to physically notch a portion of the flex circuit to make room for an input receptacle. In these situations, it is possible to introduce a new layer on the flex circuit fully dedicated to placement of electrodes 102, 104. However, doing so would require increasing the height of the device, which may be undesirable for many such input devices.

Thus, according to an embodiment, in order to maximize the use of the first surface of the flex circuit without increasing the size of the device, one or more of the electrodes may be formed on the first surface of the flex circuit while the remaining electrodes are formed on the opposing surface of the substrate. When the flex circuit and the substrate are placed together during the manufacturing process, the electrodes arranged on the substrate and the flex circuit may be aligned together to achieve a desired pattern similar to the pattern shown in FIG. 1a.

Various different methods may be utilized to place the electrodes on the substrate. For example, the electrodes may be painted on the substrate using conductive paint or printed on the substrate using conductive ink. Alternatively, the conductive material may be sputtered on the substrate to obtain the electrodes. In some embodiments, insulating material may also be formed between the electrodes to create more efficient capacitance between the electrodes. Also, once the electrodes have been formed, an additional layer of insulating material may be formed on the electrodes to further insulate the electrodes from the underlying circuitry or other underlying modules, except for areas where the substrate electrodes need to have electrical contact with the underlying electrodes.

Figure 2A:
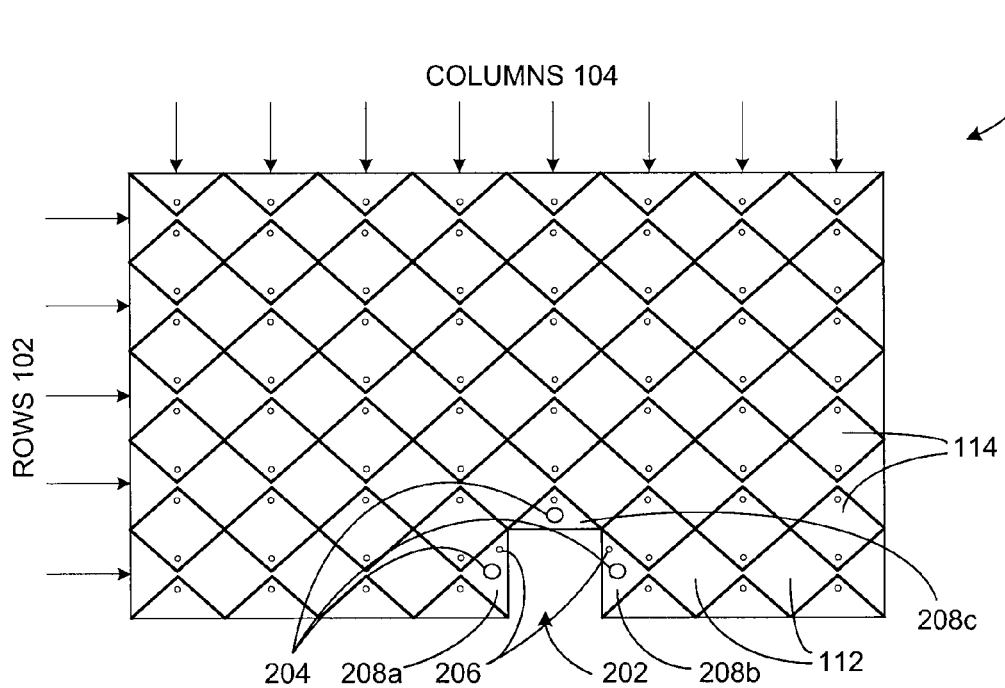
FIG. 2a depicts an exemplary perspective view of an surface of a flex circuit having a double-diamond electrode pattern including a notch.

FIG. 2a illustrates an exemplary flex circuit 200 having a notch 202. Although the notch 202 is shown as being cut out in this embodiment, a notch may also refer to a portion that is not physically cut out from the flex circuit, but is occupied by another circuit module or is otherwise unavailable for placement of electrodes on the flex circuit. For example, the notch 202 may include an area of the flex circuit 202 that is occupied by a circuit module. Further, although the depicted notch is rectangular and is located in the proximity of a border of the flex circuit, a notch may be of any shape and may be located anywhere on the flex circuit. In various embodiments, the notch may displace a portion of the pattern of sensing electrodes on the flex circuit.

Figure 2B:
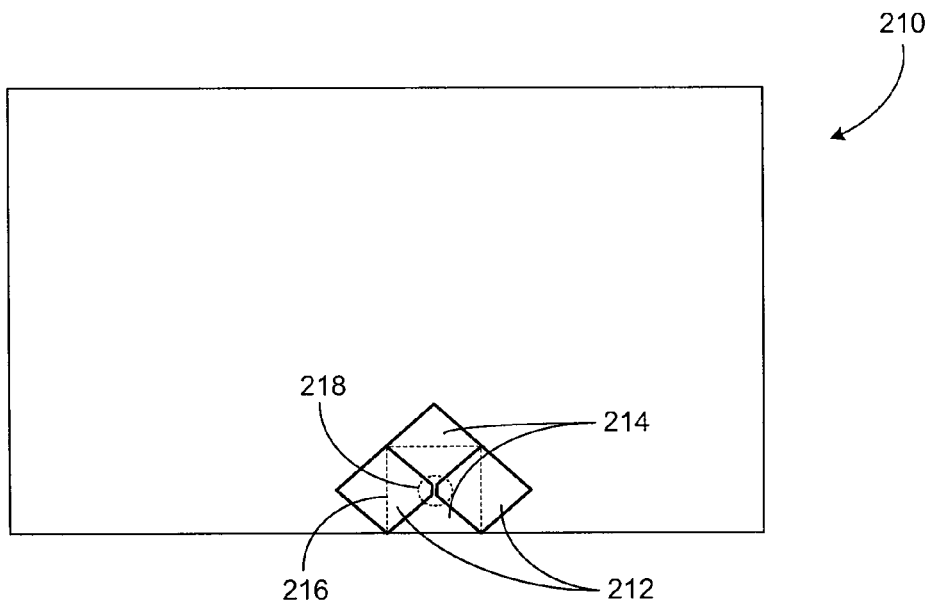

To obtain a complete pattern of sensing electrodes, the electrodes displaced from the electrode pattern on the flex circuit are formed on the surface of the substrate 210 facing the flex circuit 200, shown in FIG. 2b. The row electrodes 212 and column electrodes 214 correspond to missing portions of electrodes 208a-208c arranged on the flex circuit 200 at the border of the notch 202, in addition to a lower triangular electrode that has no corresponding electrode on the flex circuit 200. The area 216 of the substrate corresponds to the notch 202 of the flex circuit 200. In one embodiment, after formation of the electrodes 212, 214, the area 216 of the substrate may be covered with a layer of insulating material to prevent electrical shortage between the electrodes 212, 214 and whatever module placed inside the notch 202.

To electrically connect the row electrodes 212 and column electrodes 214 to the rows 102 and columns 104 of the flex circuit 200, respectively, the flex circuit 200 may be further provided with contacts 204 on the electrodes 208a-208c of the flex circuit 200. Thus, when the substrate 210 is placed facing the flex circuit 200 during the manufacturing process, an electrical connection is made between the substrate electrodes 212, 214 and the electrodes 208a-208c, respectively. Alternatively, the contacts 204 may be formed on the substrate 210 and later connected to the 208a-208c. In yet another embodiment, the row electrodes 212 and column electrodes 214 may be constructed such that they cover the entire surface of the electrodes 208a-208c and make an electrical connection with the electrodes 208a-208c without a need for the contacts 204.

Figure 2C:
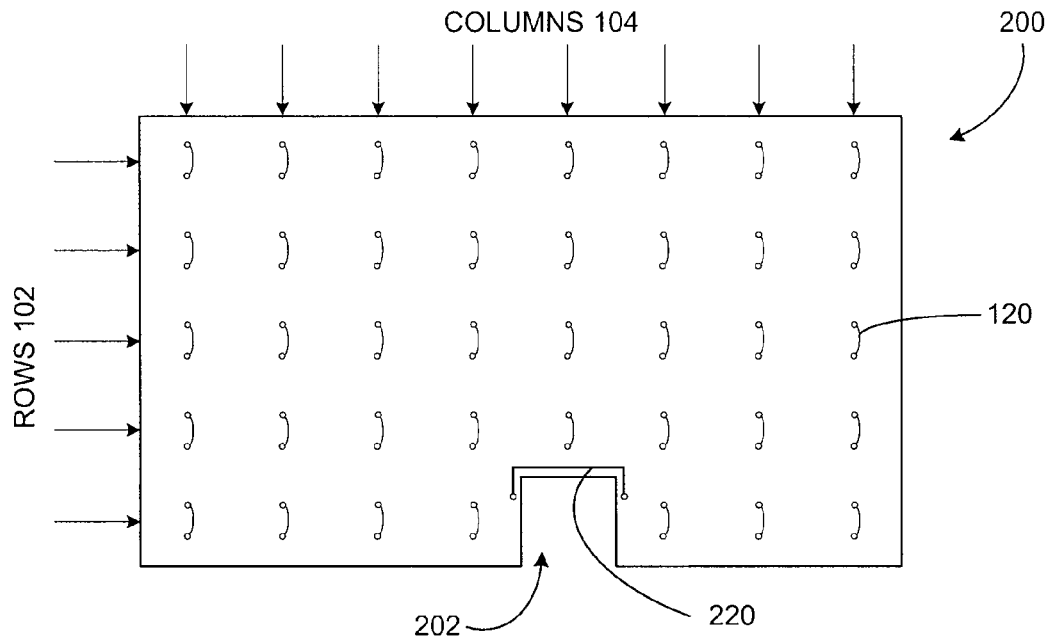

In order to ensure that the lower column electrode 214 is electrically connected to the upper column electrode 214, an area 218 is provided between the two row electrodes 212 in the horizontal direction. Conductive material is disposed on the area 216 so as to connect the column electrodes 214 while electrically insulating the row electrodes 212. In order to electrically connect the row electrodes 212, an electrical connectivity may be provided to both sides of the rows 102 on the flex circuit such that both electrodes 208a, 208b are electrically connected to the same row without a need to create a direct connection from the electrodes 208a to the electrode 208b. Alternatively, as shown in FIGS. 2a and 2c, the electrodes 208a, 208b may be coupled together via an conductive pattern 220 arranged on the second surface of the flex substrate 200, via two vias 206 that connect the electrodes 208a, 280b to the conductive pattern 220 through the flex circuit 200.

Figure 3A:
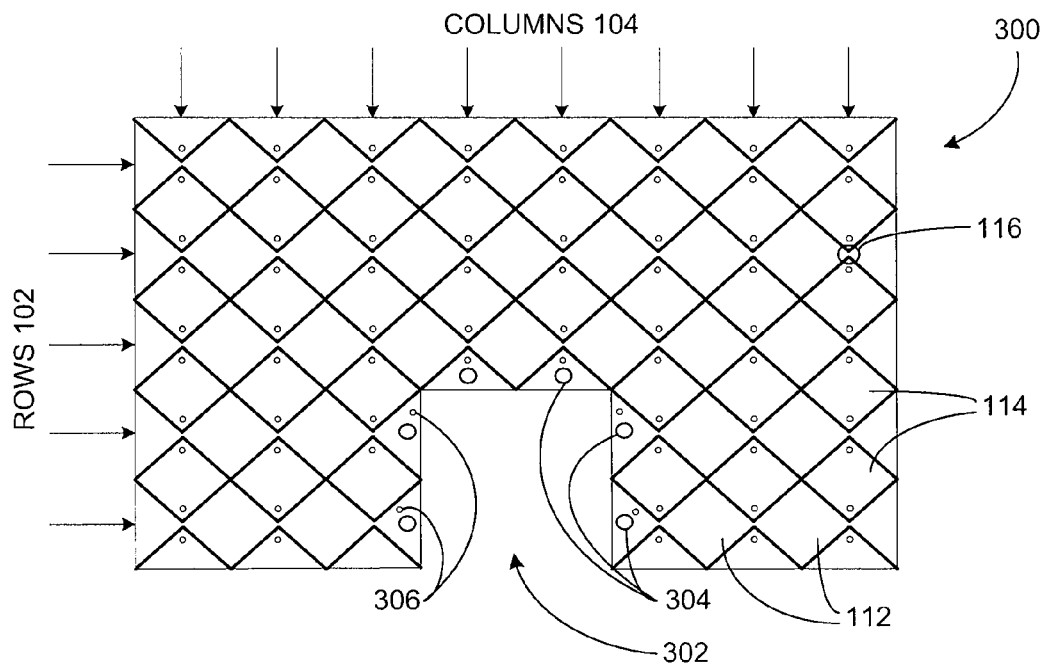
FIG. 3a depicts an exemplary perspective view of a surface of another exemplary flex circuit having a double-diamond electrode pattern including a notch.

FIG. 3a depicts an exemplary flex circuit 300 having a notch 302 that is relatively larger than the notch 202 shown in FIG. 2a. In this embodiment, the notch 302 may be large enough to displace several electrodes from the flex circuit 300. In order to provide sensing capabilities on the area of the notch 302, a pattern similar to the electrode pattern of FIG. 2b may be provided on the substrate 310 and electrically coupled to the rows 102 and columns 104 of the flex circuit 300. Similarly to the flex circuit 200 shown in FIG. 2a, the row electrodes and column electrodes arrange on the flex circuit 300 around the border of the notch 302 may be coupled to the corresponding row electrodes 312 and column electrodes 314 via contacts 304. Thus, when the substrate 310 is placed on the flex circuit 300 during the manufacturing process, an electrical connection is made between the substrate electrodes 312, 314 located on the edge of the notch 302 and the electrodes located on the flex circuit 300 near the border of the notch 302. Alternatively, the contacts 304 may be formed on the substrate 310 and later connected to the electrodes of the flex circuit 300 located near the border of the notch 302. In yet another embodiment, the row electrodes 312 and column electrodes 314 may be provided such that they cover the entire surface of the electrodes on the border of the notch 302 and make an electrical connection therewith after the substrate 310 is securely placed facing the flex circuit 300, without a need for the contacts 304.

Figure 3B:
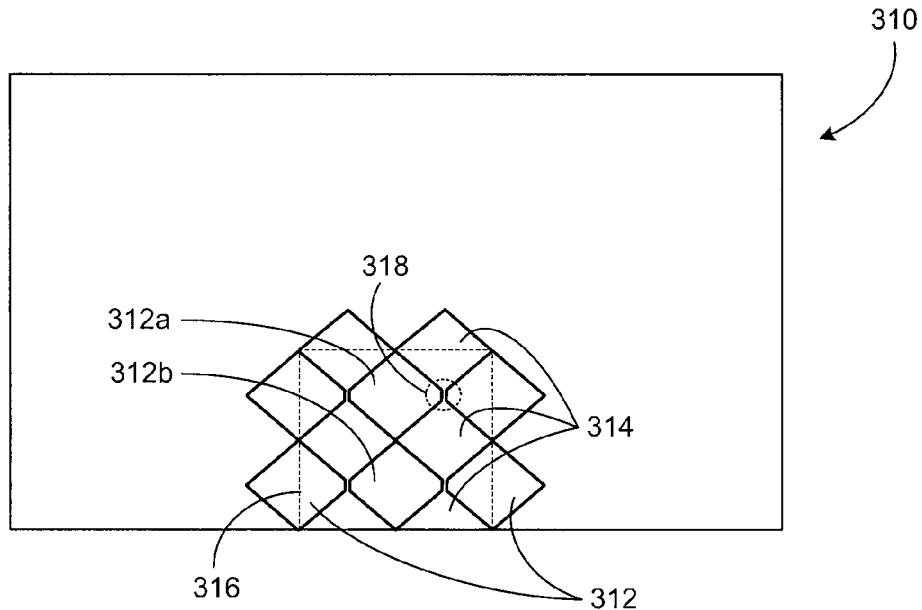
Figure 3C:
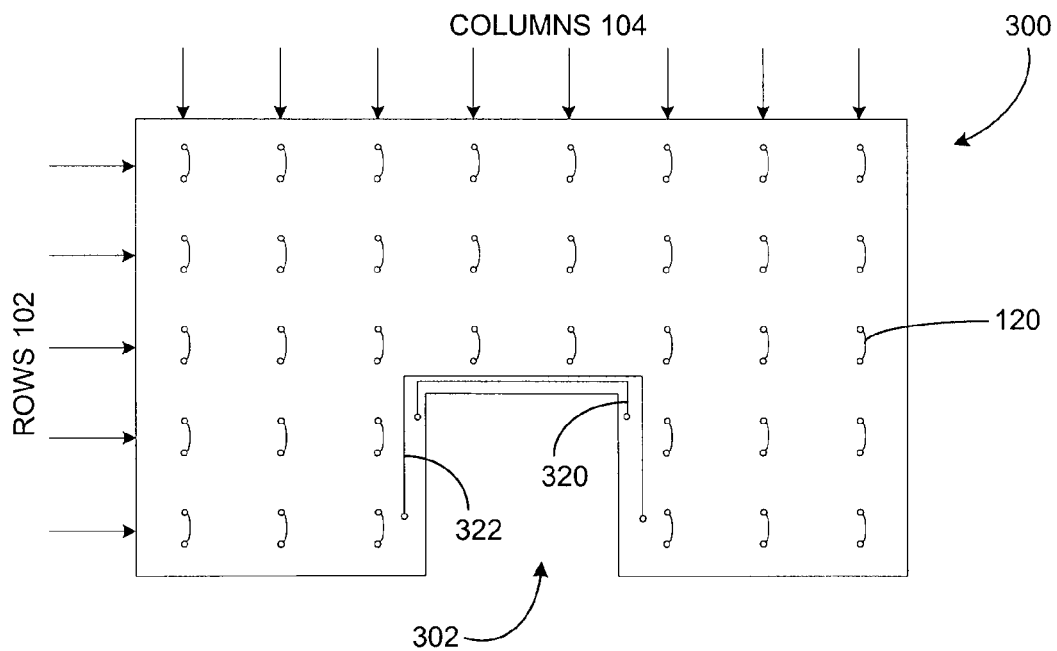

The area 316 shown in FIG. 3b corresponds to the notch 302 of the flex circuit 300. As previously explained, the area 316 may be covered with a layer of insulating material to prevent shortage of the electrodes 312, 314. The column electrodes 314 are electrically connected in a vertical direction on the surface of the substrate 310 via areas 318 which separate the row electrodes 312. In one embodiment, the outer row electrodes 312 may be connected using vias 306 and electrical patterns 320, 322 formed on the second surface of the flex circuit 300, as shown in FIG. 3c. Alternatively, electrical connectivity may be provided on both sides of the rows 102 such that the row electrodes on the border of the notch 302 may be electrically connected without a need to connect them through the second surface of the flex circuit 300. In both these embodiments, however, the row electrodes 312a, 312b positioned in an intermediary portion of the area 316 may remain disconnected from the other row electrodes 102. Thus, in these embodiments, a controller or processor coupled to the rows 102 and columns 104 may be configured such that when one or more of the columns 104 connected to the column electrodes 314 indicates an input being applied, while none of the rows 102 indicate an input being applied, it may be determined that the input is applied to an area of or near the row electrodes 312a, 312b.

Figure 3D:
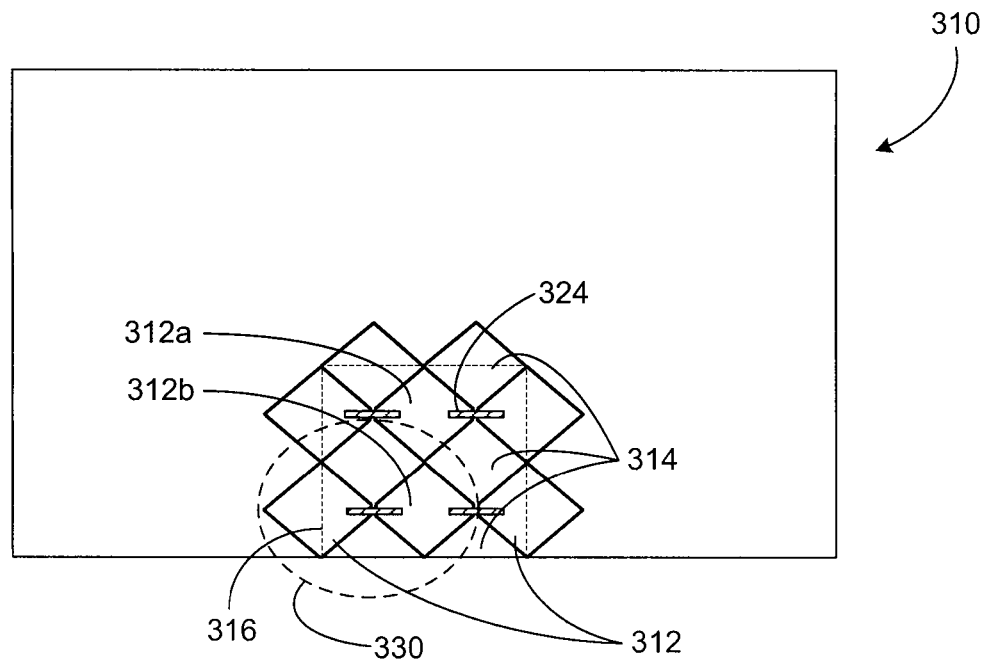

Alternatively, the row electrodes 312a, 312b may be connected to their adjacent row electrodes 312 on the substrate. FIG. 3d depicts the substrate 310 in accordance to this embodiment, in which the row electrodes 312a, 312b are connected to their adjacent row electrodes 312 in the horizontal direction via an additional conductive layer 324 formed on the area 318. The conductive layer 324 may be insulated from the area 318 via a layer of insulating material.

Figure 3E:
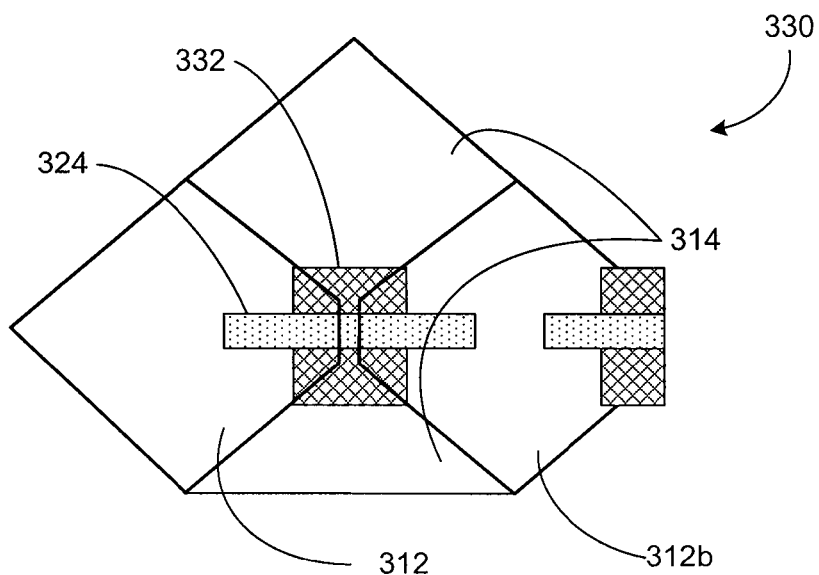
FIG. 3e depicts an exemplary perspective view of a zoomed-in portion of FIG. 3d.

FIG. 3e depicts a magnified view 330 of the substrate 310, including the conductive layer 324 and the layer of insulating material 332. Both the insulating material 332 and the conductive layer 324 may be painted, printed, or sputtered on the substrate 310 after the electrodes 312, 314 have been formed. The thickness of the paint or ink may be so small such that it creates negligible interference with any module located within the notch 302 of the flex circuit 300. To further insulate the electrodes 312, 314 as well as the aforementioned layers 324, 332, an additional insulating layer (not shown) may also be formed at the end of the manufacturing process to prevent exposure of any conductive layer formed on the substrate 310.

Figure 4A:
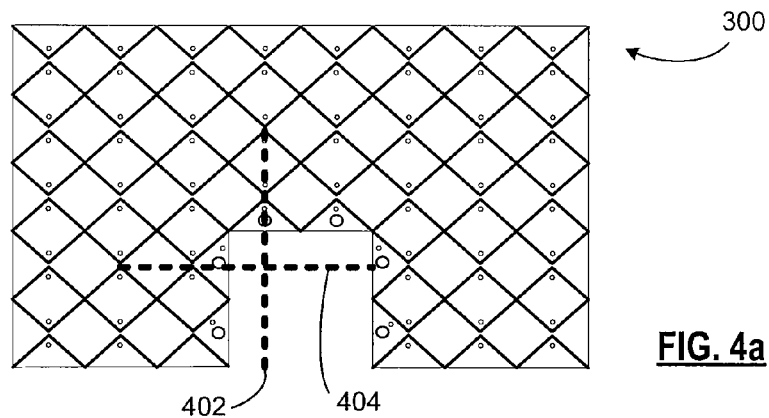
FIGS. 4a-4c depict exemplary cross-sectional views of a capacitive sensor including a flex circuit having a notch.
Figure 4B:
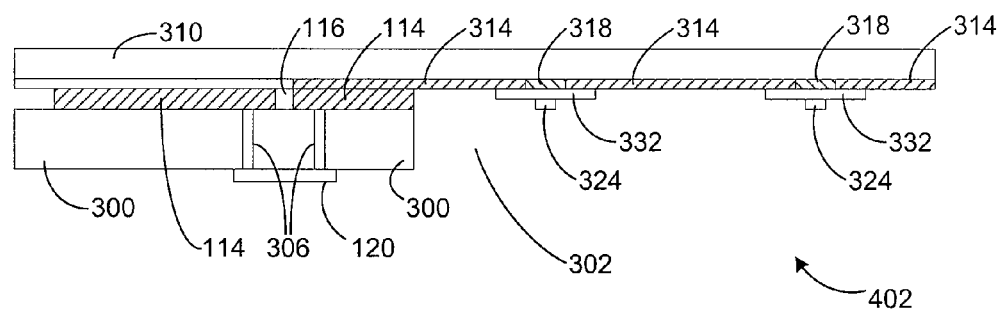
Figure 4C:
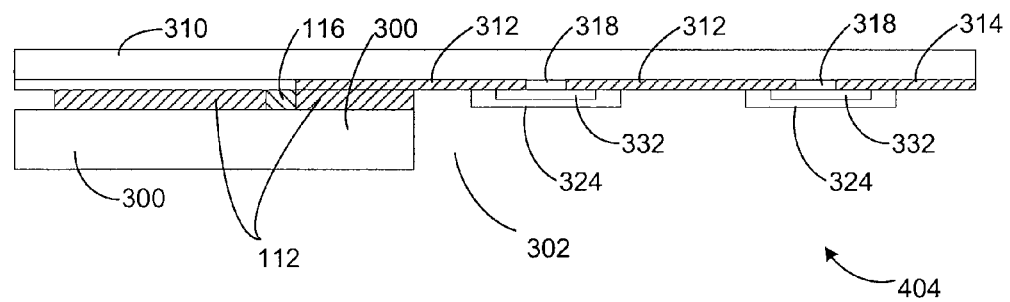

FIGS. 4a-4c provide a cross-sectional views of the substrate 310 and the flex circuit 300 near an area of the notch 302, according to an exemplary embodiment. FIG. 4a represents the view points 402, 404 shown in FIGS. 4b and 4c, respectively.

FIG. 4b represents a vertical cross-sectional view 402 of the substrate 310 and the flex circuit 300 near an area of the notch 302, according to an exemplary embodiment. In this figure, the cross-sectional view is from a left side of the flex circuit 300 shown in FIG. 4a. As shown in this embodiment, the column electrodes 114 arranged on the flex circuit 300 are separated by an area 116. The column electrodes are electrically connected to each other via two vias 306 coupled to electrical pattern 120 on an opposite surface of the flex circuit 300. On an area bordering the notch 302, the column electrode 114 makes an electrical contact with a column electrode 314 formed on the substrate 310. In an embodiment, the column electrode 114 may not make a direct contact with the column electrode 314, but may rather be separated from the column electrode 314 via an insulating layer and may be electrically connected to the column electrode 314 via a contact 304 (not shown) through the insulating layer. The column electrodes 314 thus supplement the pattern of the column electrodes 114 in a continuous fashion. The column electrodes 314 are connected via areas 318 located between the row electrodes 312 (not shown). The row electrodes 312 (not shown) are connected to each other via conductive layers 324 formed on an insulating layer 332.

FIG. 4c represents a horizontal cross-sectional view 404 of the substrate 310 and the flex circuit 300 near an area of the notch 302, according to an exemplary embodiment. In this figure, the cross-sectional view is from a lower side of the flex circuit 300 shown in FIG. 4a. As shown in this embodiment, the row electrodes 112 are connected to each other on the flex circuit 300 through the area 116. Near the border of the notch 302, the row electrode 112 makes an electrical contact with a row electrode 312 formed on the substrate 310. In an embodiment, the row electrode 112 may not make a direct contact with the row electrode 312, but may rather be separated from the row electrode 312 via an insulating layer and may be electrically connected to the row electrode 312 via a contact 304 (not shown) through the insulating layer. The row electrodes 312 thus supplement the pattern of the row electrodes 112 in a continuous fashion. The row electrodes 312 are separated by areas 318, but are connected to each other via conductive layers 324 formed on an insulating layer 332.

Figure 5:
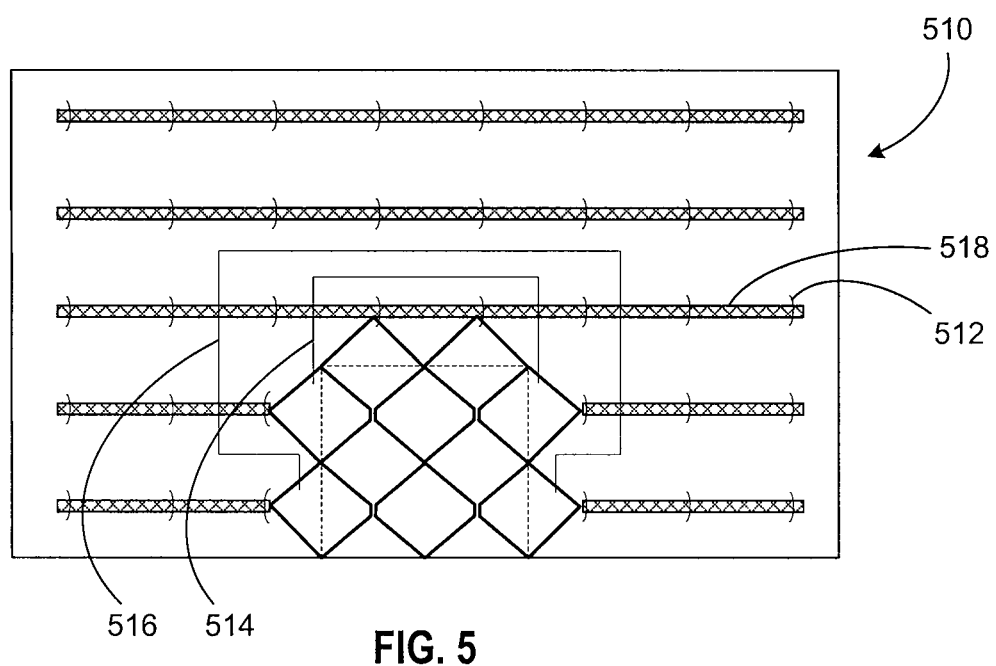

FIG. 5 depicts a perspective view of a substrate 510 in which conductive patterns 512 are formed on the substrate 510 to electrically connect the corresponding column electrodes 114, according to an embodiment. This embodiment simplifies the manufacturing process by eliminating the need to construct vias and conductive patterns in the flex circuit 300, as shown in FIG. 3c. The substrate 510 may also be provided with conductive patterns 514, 516, which correspond to conductive patterns 320, 322 of FIG. 3c. In order to insulate the conductive patterns 512 from the row electrodes 112 near the region of the area 116, the substrate may also be provided with layers of insulating material 518 to cover the conductive patterns 512.

Figure 6:
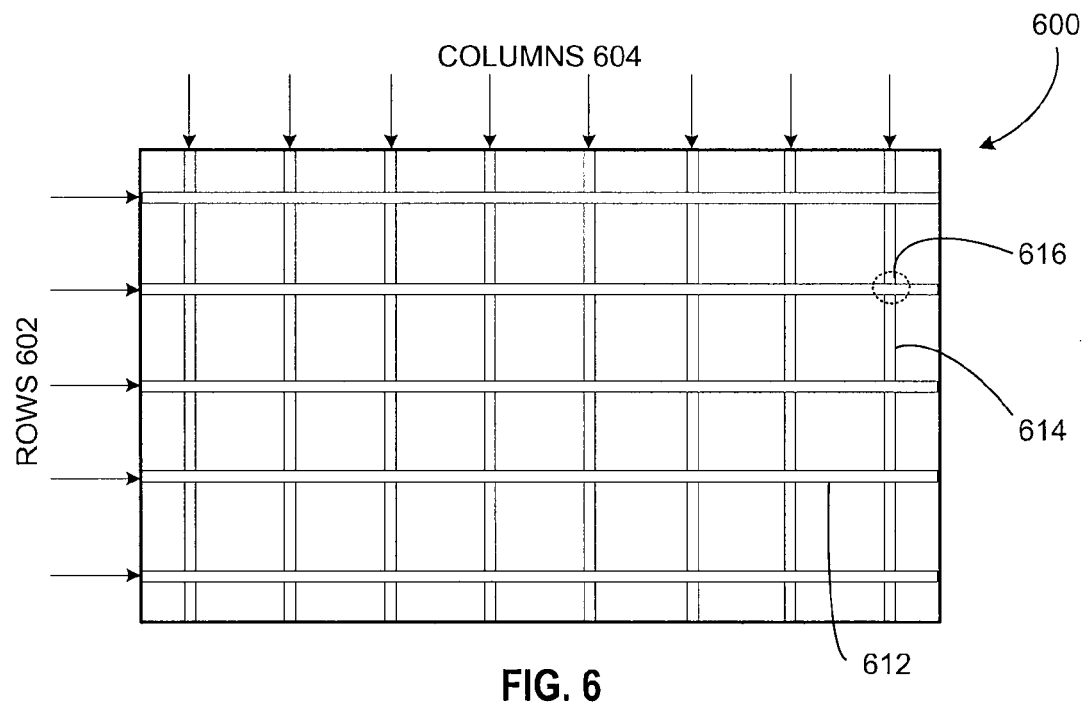
FIG. 6 depicts an exemplary perspective view of a surface of yet another exemplary flex circuit of a capacitive sensor having a mutual-capacitance pattern.

As previously stated, the touch sensor using the flex circuit shown in FIG. 1a may operate with self capacitance or mutual capacitance. FIG. 6 depicts a perspective diagram of a flex circuit 600 of a capacitive sensor using an alternative form of mutual capacitance, according to an exemplary embodiment. In this embodiment, multiple row electrodes 612 are provided across multiple column electrodes 614. The overlap of each row electrode 612 and each column electrode 614 constitutes a capacitor 616. An insulating layer (not shown) may be provided at the area of the overlap to increase the capacitance of the capacitors 616. The rows 602 may be driven via a control unit periodically to charge the capacitors 616 and, as the capacitor 616 are discharged, the voltage of the columns 604 are monitored by a sensing unit. As long as no input is applied to the surface of the substrate, a predetermined voltage may be expected at the columns 604. However, if an input is applied to the surface of the substrate, it may steal away some of the charge at one or more of the nearby capacitors 616, resulting in a lower voltage being sensed on the corresponding column 604 by the sensing unit. Based on the row 602 being driven and the column 604 having a lower charge than expected, the sensing unit can determine the position of the touch.

Figure 7A:
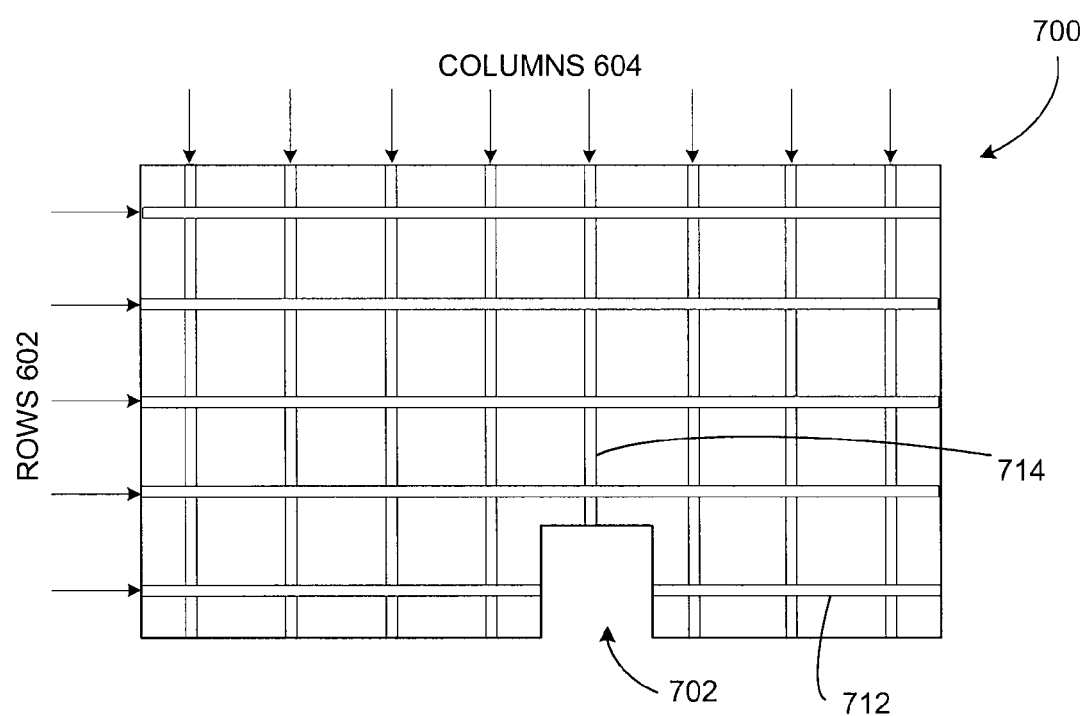
FIG. 7a depicts an exemplary perspective view of a surface of a flex circuit having a mutual-capacitance pattern including a notch.
Figure 7B:
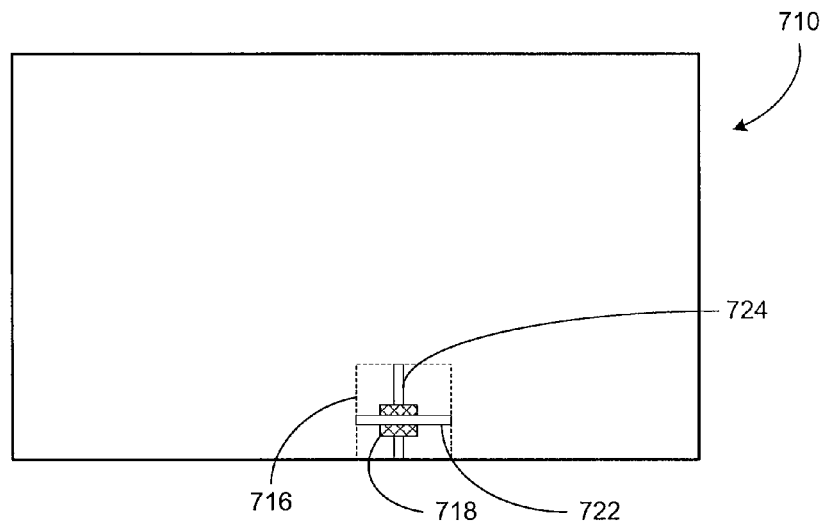

FIG. 7a illustrates an exemplary flex circuit 700 having a notch 702. The notch 702 displaces or prohibits the placement of electrodes 712, 714 in a continuous pattern. Thus, portions of the electrodes 712, 714 that cannot be placed on the flex circuit 700 due to the notch 702 are formed on a surface of the substrate 710 facing the flex circuit 700 in a continuous fashion consistent with the pattern of electrodes 712, 714, shown in FIG. 7b. The row electrodes 722 and column electrodes 724 correspond to the electrodes 712, 714 of the flex circuit 700. The area 716 also corresponds to the notch 702 of the flex circuit 700. In one embodiment, the area 716 may be covered with insulating material to prevent electrical shortage between the electrodes 722, 724 and any modules placed inside the notch 702. In addition, a layer of insulating material 718 may be provided between the electrodes 722, 724.

According to an embodiment, the arrangement of electrodes shown in FIG. 6 can be obtained by forming all the row electrodes on the flex circuit and forming all columns on a surface of the substrate facing the flex circuit. An insulating layer is also formed on the row electrodes. Thereafter, the substrate is placed on the insulating layer such that the overlap of the rows and columns creates the touch sensing capacitors.

Figure 8:
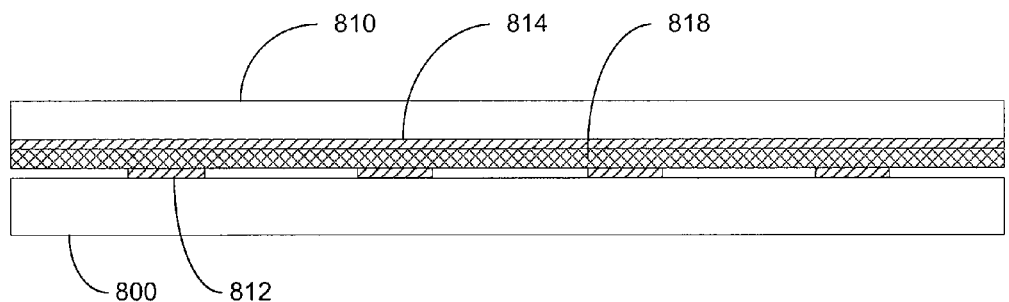
FIG. 8 depicts an exemplary cross-sectional view of a capacitive sensor having rows and columns of a mutual-capacitance pattern arranged on the flex circuit and the substrate, respectively.

FIG. 8 provides a cross-sectional view of the capacitive sensor according to this embodiment. As shown in FIG. 8, the row electrodes 812 are formed on the flex circuit 800 and the column electrodes 814 are formed on a surface of the substrate 810 facing the flex circuit 800. The insulating layer 818 is provided between the row electrodes 812 and the column electrodes 814. Since in this embodiment the column electrodes need not be etched on the flex circuit, this embodiment simplifies the manufacturing process of the touch sensor.

Figure 9A:
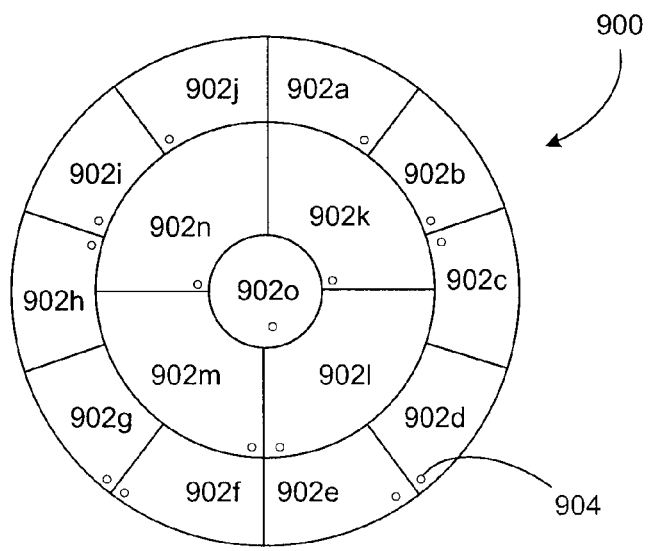
FIGS. 9a-9b depicts an exemplary perspective view of a surface of flex circuit of a capacitive sensor having a circular electrode pattern.
Figure 9B:
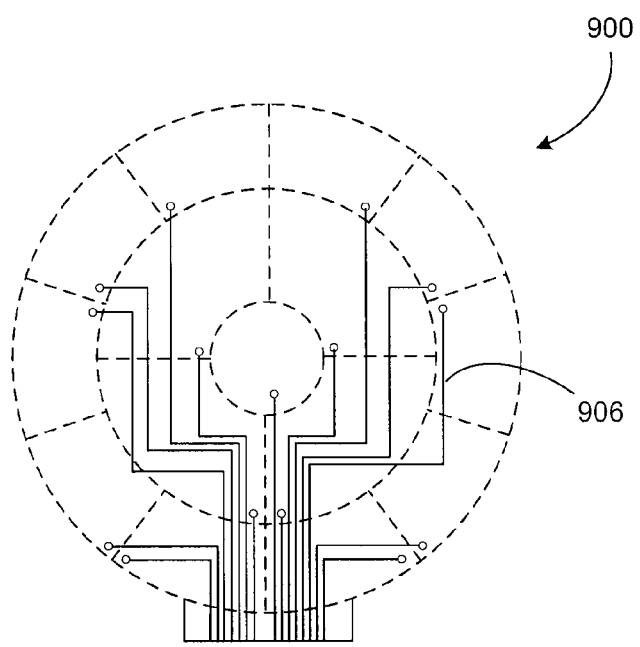

FIG. 9a illustrates a perspective view of a circular flex circuit 900 capacitive sensor according to yet another embodiment. According to this embodiment, the flex circuit 900 includes electrodes 902a-902n arranged on a first surface of the flex circuit 900. Each electrode 902a-902n includes a via 904 from the electrodes 902a-902n to a second surface of the flex circuit 900. The second surface of the flex circuit 900, as shown in FIG. 9b, includes traces 906, each coupled individually to one of the electrodes 902a-902n via one of the vias 904. A substrate (not shown), which may be made of, for example, glass, plastic, plastic, glass, PET material, ceramics, or other material is placed on the first surface of the flex circuit 900. A controller or processor coupled to the traces 906 can track the position of an input such as a fingertip applied to the surface of the substrate.

Figure 10A:
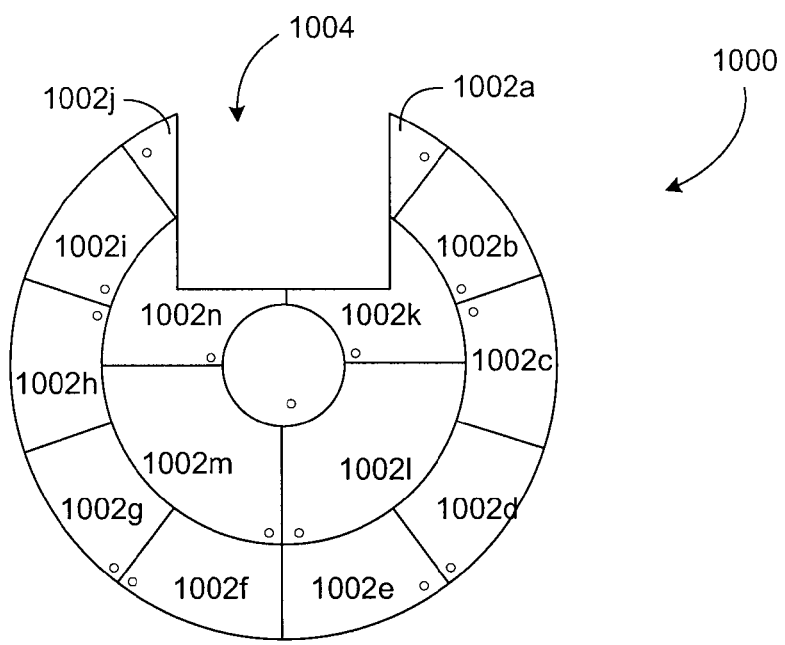
FIG. 10a depicts an exemplary perspective view of a surface of a flex circuit having a circular electrode pattern including a notch.
Figure 10B:
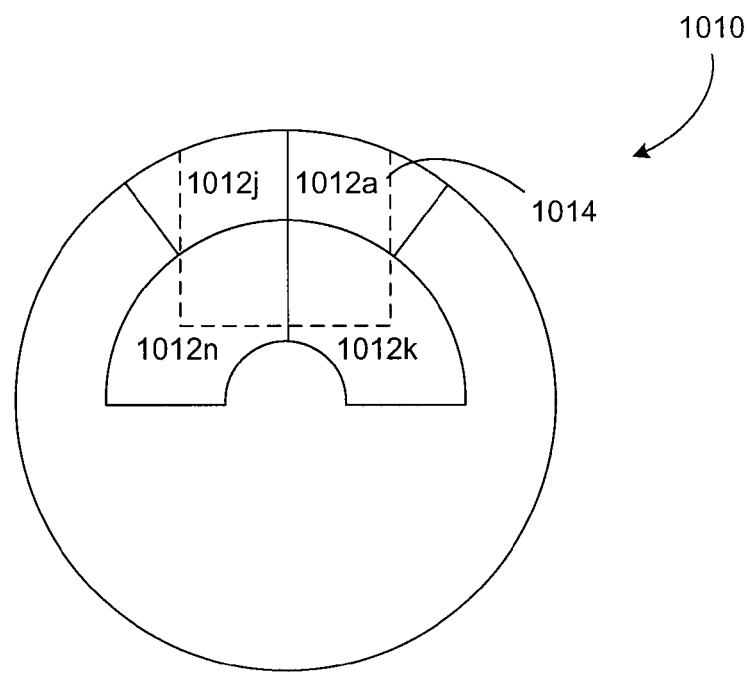

FIG. 10a depicts a perspective view of a circular flex circuit 1000, in which a notch 1004 represents a portion of flex circuit 1000 that is physically removed or is a portion of flex circuit 1000 that is occupied by another module. In order to obtain a complete electrode pattern as shown in FIG. 9a, the electrodes that may have occupied notch area 1004 on the flex circuit 1000 to complete the electrode pattern are formed on a surface of the substrate 1010, shown in FIG. 10b. The electrodes 1012a, 1012j, 1012k and 1012n correspond and electrically connect to the electrodes 1002a, 1002j, 1002k and 1002n, respectively, all of which have been cut off on the flex circuit 1000. The area 1014 also corresponds to the notch 1004 of the flex circuit 1000. In one embodiment, the area 1014 may be covered with insulating material to prevent electrical shortage between the electrodes 1012a, 1012j, 1012k and 1012n and any module placed inside the notch 1004 of the flex circuit 1000.

Figure 11:
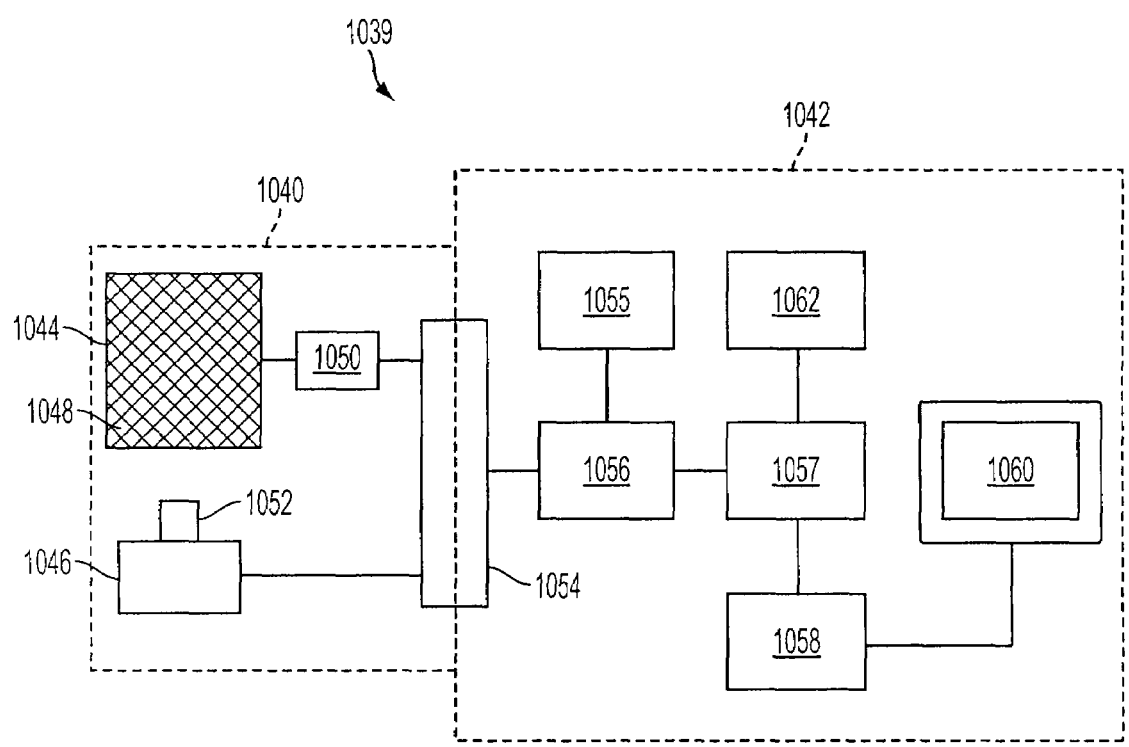
FIG. 11 illustrates an simplified exemplary block diagram of a computing system, according to one aspect.

FIG. 11 illustrates an example of a simplified block diagram of a computing system 1039, according to one aspect. The computing system may generally include input device 1040 operatively connected to computing device 1042. By way of example, the computing device 1042 can correspond to a computer, PDA, media player or the like. As shown, input device 1040 may include input device 1040 can generally correspond to the capacitive sensor 1044, which may correspond to the any of the aforementioned embodiments, and one or more movement detectors 1046. The capacitive sensor 1044 can be configured to generate tracking signals and movement detector 1046 can be configured to generate a movement signal when the capacitive sensor is depressed. Although the capacitive sensor 1044 may be widely varied, in this embodiment, capacitive sensor 1044 can include capacitance sensors 1048 and control system 1050 (which can generally correspond to the sensor controllers described above) for acquiring position signals from sensors 1048 and supplying the signals to computing device 1042. Control system 1050 can include an application specific integrated circuit (ASIC) that can be configured to monitor the signals from sensors 1048, to compute the absolute location, angular location, direction, speed and/or acceleration of the monitored signals and to report this information to a processor of computing device 1042. Movement detector 1046 may also be widely varied. In this embodiment, however, movement detector 1046 can take the form of a switch that generates a movement signal when the capacitive sensor 1044 is depressed. Movement detector 1046 can correspond to a mechanical, electrical or optical style switch. In one particular implementation, movement detector 1046 can be a mechanical style switch that includes protruding actuator 1052 that may be pushed by the capacitive sensor 1044 to generate the movement signal. By way of example, the switch may be a tact or dome switch.

Both the capacitive sensor 1044 and movement detector 1046 can be operatively coupled to computing device 1042 through communication interface 1054. The communication interface provides a connection point for direct or indirect connection between the input device and the electronic device. Communication interface 1054 may be wired (wires, cables, connectors) or wireless (e.g., transmitter/receiver).

Referring to computing device 1042, it may include processor 1057 (e.g., CPU or microprocessor) configured to execute instructions and to carry out operations associated with computing device 1042. For example, using instructions retrieved from memory, the processor can control the reception and manipulation of input and output data between components of computing device 1042. Processor 1057 can be configured to receive input from both movement detector 1046 and the capacitive sensor 1044 and can form a signal/command that may be dependent upon both of these inputs. In most cases, processor 1057 can execute instruction under the control of an operating system or other software. Processor 1057 may be a single-chip processor or may be implemented with multiple components.

Computing device 1042 may also include input/output (I/O) controller 1056 that can be operatively coupled to processor 1057. (I/O) controller 1056 can be integrated with processor 1057 or it may be a separate component as shown. I/O controller 1056 can generally be configured to control interactions with one or more I/O devices that may be coupled to the computing device 1042, as for example input device 1040 and orientation detector 1055, such as an accelerometer. I/O controller 1056 can generally operate by exchanging data between computing device 1042 and I/O devices that desire to communicate with computing device 1042.

Computing device 1042 may also include display controller 1058 that can be operatively coupled to processor 1057. Display controller 1058 can be integrated with processor 1057 or it may be a separate component as shown. Display controller 1058 can be configured to process display commands to produce text and graphics on display screen 1060. By way of example, display screen 1060 may be a monochrome display, color graphics adapter (CGA) display, enhanced graphics adapter (EGA) display, variable-graphics-array (VGA) display, super VGA display, liquid crystal display (e.g., active matrix, passive matrix and the like), cathode ray tube (CRT), plasma displays and the like. In the illustrated embodiment, the display device corresponds to a liquid crystal display (LCD).

In most cases, processor 1057 together with an operating system operates to execute computer code and produce and use data. The computer code and data can reside within program storage area 1062 that may be operatively coupled to processor 1057. Program storage area 1062 can generally provide a place to hold data that may be used by computing device 1042. By way of example, the program storage area may include Read-Only Memory (ROM), Random-Access Memory (RAM), hard disk drive and/or the like. The computer code and data could also reside on a removable program medium and loaded or installed onto the computing device when needed. In one embodiment, program storage area 1062 can be configured to store information for controlling how the tracking and movement signals generated by the input device may be used, either alone or in combination for example, by computing device 1042 to generate an input event command, such as a single button press for example.

Figure 12:
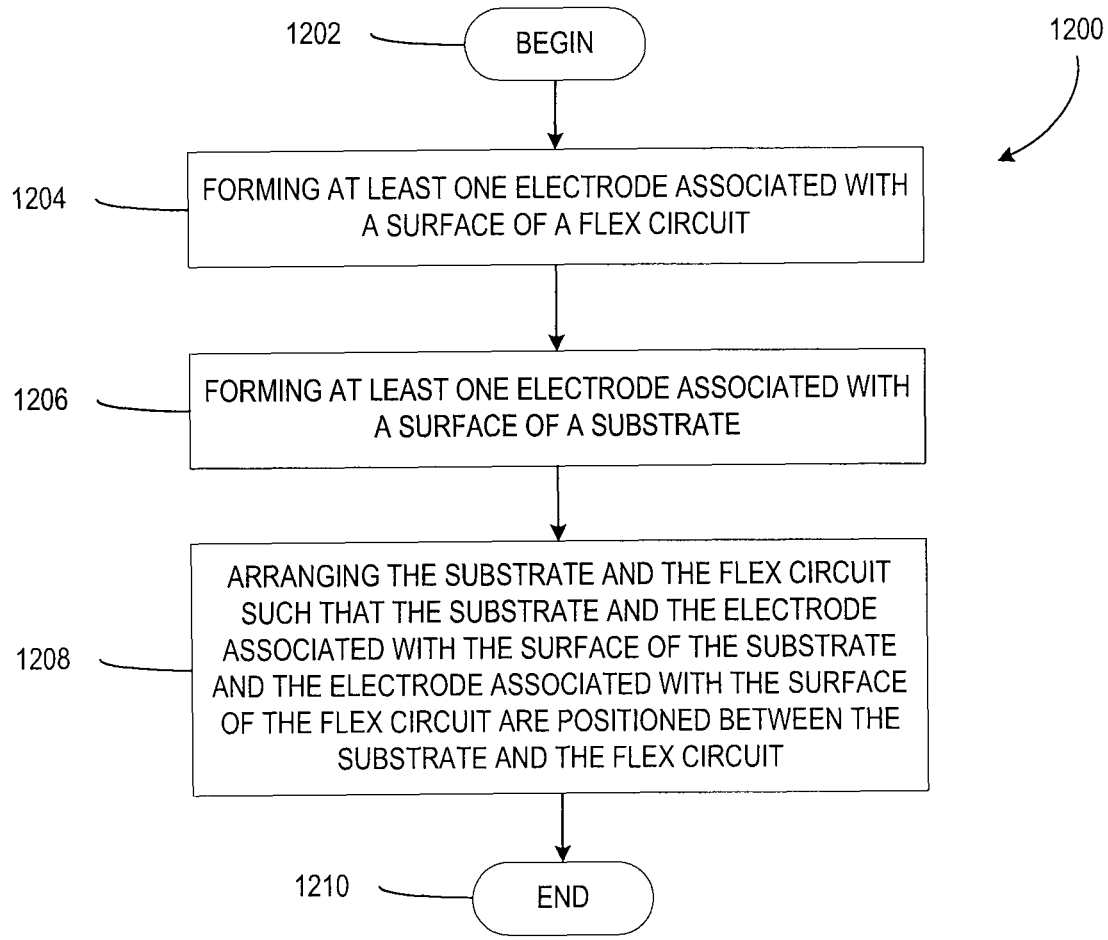
FIG. 12 depicts an exemplary flow process diagram for manufacturing a capacitive sensor, according to an embodiment.

FIG. 12 depicts an exemplary flow process diagram 1200 for manufacturing a capacitive sensor, according to an embodiment. The process 1200 may begin with block 1202 to initialize the manufacturing process. For example, the process 1200 may identify an area of the substrate that overlaps a notch in the flex circuit as previously described. The process 1200 may then form one or more electrodes on a surface of the flex circuit, block 1204. The process 1200 may also form at least one electrode on a surface of the substrate, block 1206. The electrodes formed on the substrate may be formed within an area of the substrate identified as overlapping the notch. An insulating layer may also be formed, either on the first set of electrodes, or on the second set of electrodes, such that when the flex circuit and the substrate are placed together, the insulating layer is arranged between the first and the second set of electrodes. The flex circuit and the substrate are then placed together such that the flex circuit electrodes and the substrate electrodes are securely positioned between the flex circuit and the substrate, block 1208. The process 1200 may then end at block 1210.

While various embodiments have been described, there are alterations, permutations, and equivalents, which fall within the scope of the claims. It should be noted that there are many alternative ways of implementing the disclosed methods and apparatuses. It is therefore intended that the following appended claims be interpreted as including all such alterations, permutations, and equivalents.

What is claimed is:

1. A capacitive sensor comprising:
a flex circuit,
a substrate, and
a plurality of conductive electrodes configured to sense an input associated with the substrate, the plurality of conductive electrodes comprising at least one electrode associated with a surface of the substrate and at least one electrode associated with a surface of the flex circuit,
a notch defined in the flex circuit, the notch establishing a physical gap in the flex circuit and a discontinuity in the at least one electrode associated with a surface of the flex circuit,
the at least one electrode associated with a surface of the substrate being configured so that the at least one electrode associated with a surface of the substrate fills at least a portion of the physical gap in the flex circuit and is continuous with and electrically coupled to the at least one electrode associated with a surface of the flex circuit when the substrate and the flex circuit are in a facing relationship.

2. The capacitive sensor of claim 1, wherein the substrate comprises at least one of a glass, plastic, ceramics, or polyethylene terephthalate (PET) material.

3. The capacitive sensor of claim 2, wherein the electrode associated with the surface of the substrate is formed via at least one of painting, printing or sputtering.

4. The capacitive sensor of claim 3, wherein a sensing area of the flex circuit is smaller than a total area of the substrate.

5. The capacitive sensor of claim 1, wherein the substrate comprises material having a sheet resistance less than 100 ohms/square area.

6. The capacitive sensor of claim 1, wherein the plurality of conductive electrodes comprises:
a first plurality of electrodes associated with the flex circuit in a first linear arrangement, the first plurality of electrodes being electrically coupled to each other, and
a second plurality of electrodes associated with the flex circuit in a second linear arrangement substantially perpendicular to the first linear arrangement, the second plurality of electrodes being electrically coupled to each other.

7. The capacitive sensor of claim 6, wherein the first plurality of electrodes are electrically coupled on the surface of the flex circuit and the second plurality of electrodes are electrically coupled on an opposite surface of the flex circuit using vias through which the second plurality of electrodes are connected to corresponding electrical patterns associated with the opposite surface of the flex circuit.

8. The capacitive sensor of claim 6, wherein the first plurality of electrodes are electrically coupled to each other on the surface of the flex circuit and the second plurality of electrodes are electrically coupled to each other, overlapping areas between adjacent ones of the second plurality of electrodes on the substrate, via a plurality of conductive patterns associated with the substrate.

9. The capacitive sensor of claim 6, wherein the electrode associated with the surface of the substrate comprises conductive material overlapping a portion of at least one of the first plurality of electrodes to electrically connect to the first plurality of electrodes.

10. The capacitive sensor of claim 6, wherein at least one of the first plurality of electrodes forms a mutual capacitance with at least one surrounding electrode of the second plurality of electrodes, an application of the input to the substrate causing a change in an electric charge of the at least one surrounding electrode indicative of the location of the application of the input.

11. The capacitive sensor of claim 6, wherein the plurality of conductive electrodes operate based on self-capacitance and both the first and second plurality of electrodes are sensed, an application of the input to the substrate creating a capacitance with at least one of the first plurality of electrodes and at least one of the plurality of second electrodes indicative of the location of the application of the input.

12. The capacitive sensor of claim 1, comprising a plurality of traces, at least one of the traces being coupled individually to one of the plurality of conductive electrodes.

13. The capacitive sensor of claim 12, wherein the plurality of conductive electrodes are arranged in a circular pattern.

14. A capacitive sensor comprising:
a flex circuit,
a substrate, and
a plurality of conductive electrodes configured to sense an input associated with the substrate, the plurality of conductive electrodes comprising a first plurality of electrodes having a first linear arrangement on a surface of the flex circuit and a second plurality of electrodes having a second linear arrangement on a surface of the substrate, an application of the input to the substrate causing a change in an electric charge of at least one electrode indicative of the location of an application of the input, a notch defined in the flex circuit, the notch establishing a physical gap in the flex circuit and a discontinuity in at least one electrode associated with a surface of the flex circuit, at least one electrode associated with a surface of the substrate being configured so that the at least one electrode associated with a surface of the substrate is continuous with and electrically coupled to the at least one electrode associated with a surface of the flex circuit and fills at least a portion of the physical gap in the flex circuit when the substrate and the flex circuit are in a facing relationship.

15. A capacitive sensor of claim 14, comprising an insulating layer arranged between the first and second plurality of electrodes.

16. The capacitive sensor of claim 14, wherein the substrate comprises at least one of a glass, plastic, ceramics, or polyethylene terephthalate (PET) material and the second plurality of electrodes are formed via at least one of painting, printing or sputtering.

17. A capacitive sensor comprising:
a flex circuit,
a substrate,
multiple conductive electrodes formed on and defining an electrode pattern on the flex circuit and configured to sense an input associated with the substrate, the multiple conductive electrodes comprising first electrodes and second electrodes, the first and second electrodes being mutually perpendicular and having an insulating layer therebetween, and
at least one electrode associated with a surface of the substrate and electrically connected to the first electrodes, wherein the substrate faces the flex circuit and the electrode associated with the substrate overlaps an area of the flex circuit that comprises a notch, wherein the notch prohibits placement of a portion of at least one of the first electrodes in a continuous pattern, the electrode associated with the substrate being configured to duplicate at least a portion of the electrode pattern on the flex circuit when the substrate and the flex circuit are in a facing relationship.

18. The capacitive sensor of claim 17, wherein the notch also displaces a pattern of the second plurality of electrodes, the capacitive sensor comprising:
at least one electrode associated with the surface of the substrate and coupled to the second plurality of electrodes, and
a layer of insulating material formed between the at least one electrode associated with the surface of the substrate and coupled to the first plurality of electrodes and the at least one electrode associated with the surface of the substrate and coupled to the second plurality of electrodes.

19. The capacitive sensor of claim 17, wherein the substrate comprises at least one of a glass, plastic, ceramics, or polyethylene terephthalate (PET) material, and the first electrode is formed on the surface of the substrate via at least one of painting, printing or sputtering.

20. A media player comprising a capacitive sensor, the capacitive sensor comprising:
a flex circuit,
a substrate, and
a plurality of conductive electrodes configured to sense an input associated with the substrate, the plurality of conductive electrodes comprising at least one electrode associated with a surface of the substrate and at least one electrode associated with a surface of the flex circuit, a notch defined in the flex circuit, the notch establishing a physical gap in the flex circuit and a discontinuity in the at least one electrode associated with a surface of the flex circuit, the at least one electrode associated with a surface of the substrate being configured to fill at least a portion of the physical gap in the flex circuit so that the at least one electrode associated with a surface of the substrate is continuous with and electrically coupled to the at least one electrode associated with a surface of the flex circuit when the substrate and the flex circuit are in a facing relationship.

21. A method of manufacturing a capacitive sensor, comprising:
forming at least one electrode associated with a surface of a substrate,
forming at least one electrode associated with a surface of a flex circuit, and
arranging the substrate and the flex circuit such that the electrode associated with the surface of the substrate and the electrode associated with the surface of the flex circuit are positioned between the substrate and the flex circuit,
a notch defined in the flex circuit, the notch establishing a physical gap in the flex circuit and a discontinuity in the at least one electrode associated with a surface of the flex circuit,
the at least one electrode associated with a surface of the substrate being configured to fill at least a portion of the physical gap in the flex circuit so that the at least one electrode associated with a surface of the substrate is continuous with and electrically coupled to the at least one electrode associated with a surface of the flex circuit when the substrate and the flex circuit are in a facing relationship.

22. The method of claim 21, comprising forming an insulating layer between the electrode associated with the surface of the substrate and the electrode associated with the surface of the flex circuit.

23. The method of claim 21, wherein the substrate comprises at least one of a glass, plastic, ceramics, or polyethylene terephthalate (PET) material and the step of forming the electrode associated with the surface of the substrate comprising at least one of painting, printing or sputtering a conductive material on the substrate.

24. The method of claim 21, wherein a sensing area of the flex circuit is smaller than the area of the substrate, the step of forming the electrode associated with the surface of the substrate comprising:
identifying an area of the substrate overlapping a notch of the flex circuit, and
forming the electrode associated with the surface of the substrate within the identified area.

25. The method of claim 21, further comprising:
forming a first plurality of electrodes on the flex circuit in a first linear arrangement, the first plurality of row electrodes being electrically coupled to each other, and
forming a second plurality of electrodes on the flex circuit in a second linear arrangement substantially perpendicular to the first linear arrangement, the second plurality of electrodes being electrically coupled to each other.

26. The method of claim 25, wherein the electrode associated with the surface of the substrate comprises conductive material overlapping a portion of at least one of the first plurality of electrodes to electrically connect to the first plurality of electrodes.

27. The method of claim 25, wherein at least one of the first plurality of electrodes forms a mutual capacitance with at least one adjacent electrode of the second plurality of electrodes, an application of an input to the substrate causing a change in an electric charge of the at least one adjacent electrode indicative of the location of the application of the input.

28. The method of claim 25, wherein the plurality of conductive electrodes operate based on self-capacitance, an application of an input to the substrate causing a change in electric charges of at least one of the first plurality of electrode and at least one of the plurality of second electrodes indicative of the location of the application of the input.

29. A capacitive sensor comprising:
a flex circuit comprising a surface,
a substrate comprising a surface,
multiple conductive electrodes configured to sense input, the multiple conductive electrodes comprising at least a first electrode and a second electrode, the first electrode being associated with the substrate surface and the second electrode defining an electrode pattern and being associated with the flex circuit surface,
a notch defined in the flex circuit, the notch establishing a discontinuity in the second electrode,
the first electrode being configured to duplicate at least a portion of the electrode pattern of the second electrode and electrically couple to the second electrode and eliminate the discontinuity when the substrate and the flex circuit are in a facing relationship.

30. A capacitive sensor comprising:
a flex circuit having a surface,
a substrate having a surface,
a first plurality of electrodes associated with the surface of the flex circuit,
a second plurality of electrodes defining an electrode pattern and being associated with the surface of the substrate,
at least one electrode associated with the surface of the substrate and at least one electrode associated with the surface of the flex circuit being electrically coupled when the substrate and the flex circuit are in a facing relationship, wherein both the first and second plurality of electrodes are configured to sense input associated with the substrate, the first plurality of electrodes being configured to duplicate at least a portion of the electrode pattern of the second plurality of electrodes when the substrate and the flex circuit are in a facing relationship.

31. The capacitive sensor of claim 30, wherein the substrate comprises at least one of glass, plastic, ceramics or polyethylene terephthalate (PET).

32. The capacitive sensor of claim 31, wherein the second plurality of electrodes are formed by at least one of painting, printing or sputtering.

33. The capacitive sensor of claim 30, wherein the substrate is characterized by a sheet resistance of less than 100 ohms/square area.

34. The capacitive sensor of claim 30, wherein
the first plurality of electrodes are electrically coupled to one another,
the second plurality of electrodes are electrically coupled to one another, and
the first plurality of electrodes and the second plurality of electrodes are mutually perpendicular when the substrate and the flex circuit are in a facing relationship.

35. The capacitive sensor of claim 30, comprising an insulating layer between the first and second plurality of electrodes.

36. A method of manufacturing a capacitive sensor, comprising:
forming a first plurality of electrodes on a surface of a flex circuit,
forming a second plurality of electrodes defining an electrode pattern on a surface of a substrate,
arranging the substrate and the flex circuit in a facing relationship wherein the first and second plurality of electrodes are positioned between the substrate and the flex circuit,
electrically coupling at least one of the first plurality of electrodes and at least one of the second plurality of electrodes,
wherein both the first and second plurality of electrodes are configured to sense input associated with the substrate, and wherein the first plurality of electrodes is configured to duplicate at least a portion of the electrode pattern of the second plurality of electrodes when the substrate and the flex circuit are in a facing relationship.

37. A capacitive sensor comprising:
a flex circuit comprising a surface,
a substrate comprising a surface,
multiple conductive electrodes, the multiple conductive electrodes comprising at least a first electrode and a second electrode, the first electrode being associated with the substrate surface and the second electrode defining an electrode pattern and being associated with the flex circuit surface,
the first and second electrodes being configured to be electrically coupled when the substrate and the flex circuit are in a facing relationship, wherein both the first and second plurality of electrodes are configured to sense input associated with the substrate, the first electrode being configured to duplicate at least a portion of the electrode pattern of the second electrode when the substrate and the flex circuit are in a facing relationship.

* * * * *